(12) United States Patent
Iwasaki et al.

(10) Patent No.: US 10,892,177 B2
(45) Date of Patent: Jan. 12, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Akihisa Iwasaki, Kyoto (JP); Yuya Akanishi, Ismaning (DE)

(73) Assignee: SCREEN Holdings Co., Ltd., Kyoto (JP)

(*) Notice: Subject to any disclaimer, the term of this patent is extended or adjusted under 35 U.S.C. 154(b) by 57 days.

(21) Appl. No.: 16/118,471

(22) Filed: Aug. 31, 2018

(65) Prior Publication Data

US 2019/0096721 A1    Mar. 28, 2019

(30) Foreign Application Priority Data

Sep. 22, 2017    (JP) ................. 2017-182953

(51) Int. Cl.
| | |
|---|---|
| *H01L 21/67* | (2006.01) |
| *B01D 19/00* | (2006.01) |
| *H01L 21/768* | (2006.01) |
| *H01L 21/3213* | (2006.01) |
| *H01L 21/02* | (2006.01) |

(52) U.S. Cl.
CPC .... *H01L 21/67253* (2013.01); *B01D 19/0005* (2013.01); *H01L 21/32134* (2013.01); *H01L 21/6708* (2013.01); *H01L 21/6715* (2013.01); *H01L 21/67017* (2013.01); *H01L 21/67028* (2013.01); *H01L 21/67051* (2013.01); *H01L 21/768* (2013.01); *H01L 21/02244* (2013.01)

(58) Field of Classification Search
CPC ........................................... H01L 21/67
See application file for complete search history.

(56) References Cited

U.S. PATENT DOCUMENTS

| | | | |
|---|---|---|---|
| 9,449,843 B1* | 9/2016 | Korolik | H01L 21/32135 |
| 9,797,046 B2 | 10/2017 | Yamamoto et al. | |
| 2011/0042201 A1* | 2/2011 | Von Gutfeld | C25D 5/02 204/200 |
| 2013/0342966 A1* | 12/2013 | Horio | H01G 9/028 361/524 |
| 2016/0288018 A1 | 10/2016 | Kikumoto et al. | |
| 2016/0293447 A1 | 10/2016 | Iwasaki et al. | |
| 2018/0138054 A1* | 5/2018 | Romero | H01L 21/32135 |

FOREIGN PATENT DOCUMENTS

| | | |
|---|---|---|
| JP | 2000349086 | 12/2000 |
| JP | 2002075925 | 3/2002 |
| JP | 2002170802 | 6/2002 |
| JP | 3400396 | 4/2003 |
| JP | 3505395 | 3/2004 |

(Continued)

*Primary Examiner* — Mounir S Amer
(74) *Attorney, Agent, or Firm* — JCIPRNET

(57) ABSTRACT

A substrate processing method which processes a substrate having a metal layer on a surface thereof includes a metal oxide layer forming step of forming a metal oxide layer formed of one atomic layer or several atomic layers on a surface layer of the metal layer by supplying an oxidizing fluid to the surface of the substrate, and a metal oxide layer removing step of selectively removing the metal oxide layer from the surface of the substrate by supplying an etchant to the surface of the substrate.

24 Claims, 23 Drawing Sheets

(56) References Cited

FOREIGN PATENT DOCUMENTS

| | | |
|---|---|---|
| JP | 3735394 | 1/2006 |
| JP | 2013077595 | 4/2013 |
| JP | 5390808 | 1/2014 |
| JP | 2016190195 | 11/2016 |
| WO | 2013161959 | 10/2013 |

* cited by examiner

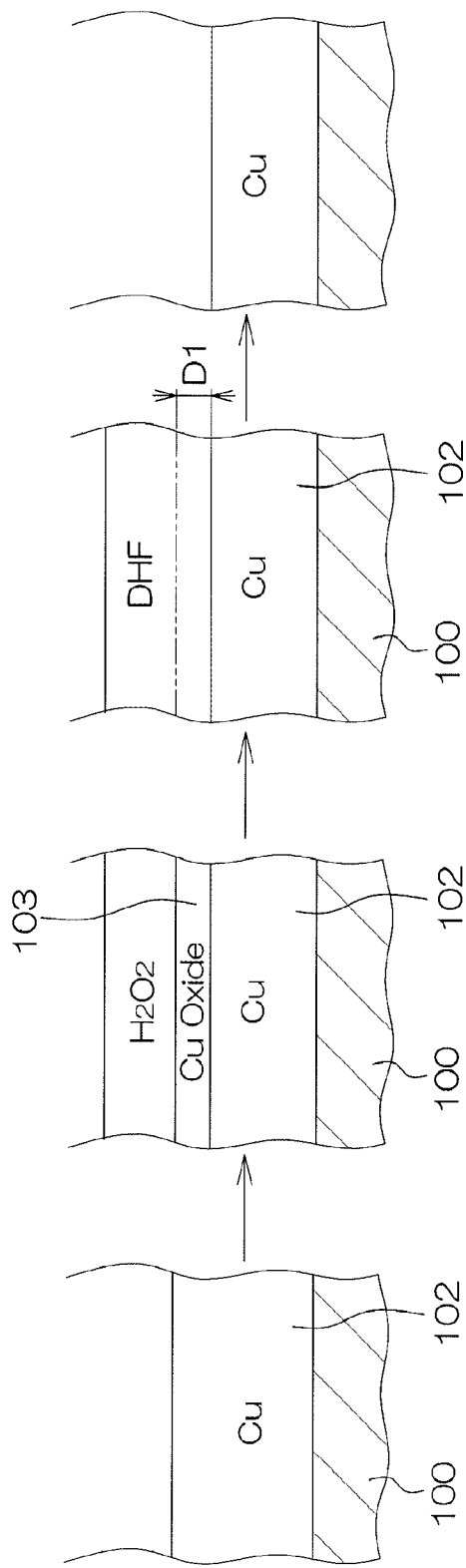

SUBSTRATE PROCESSING METHOD AND SUBSTRATE PROCESSING APPARATUS

This application corresponds to Japanese Patent Application No. 2017-182953 filed with the Japan Patent Office on Sep. 22, 2017, the entire disclosure of which is incorporated herein by reference.

BACKGROUND

Technical Field

The disclosure relates to a substrate processing method and a substrate processing apparatus. Examples of the substrate to be processed include semiconductor wafers, substrates for a liquid crystal display device, substrates for a flat panel display (FPD) such as an organic electroluminescence (organic EL) display device, substrates for an optical disc, substrates for a magnetic disk, substrates for a magneto-optical disc, substrates for a photomask, ceramic substrates, substrates for a solar cell, and the like.

Description of Related Art

In a manufacturing process of a semiconductor device or the like, a process of forming multilayer metal interconnections on a surface of a semiconductor wafer is called back end of line (BEOL) or the like. In BEOL, fine metal interconnections, plugs, vias, and the like are formed (see, for example, the specification of U.S. Patent Application Publication No. 2016/293447).

In BEOL, metal layers may be required to be etched with an accuracy of nanometers or smaller. For example, in a process called fully self-aligned via (FSAV), after a metal layer is embedded into trenches formed in an insulation film, there are cases that a surface of the metal layer is desired to be recessed within the trenches by removing the surface portion of the metal layer by a thickness of tens of nanometers using wet etching. By forming such a recessed via, it is possible to minimize a distance between the via and a neighboring interconnection. In such a case, a method capable of wet etching on the order of one atomic layer to several atomic layers is required.

Therefore, the disclosure is to provide a substrate processing method and a substrate processing apparatus capable of controlling an etching amount of a metal layer with an accuracy of nanometers or smaller in a configuration for processing a substrate having a metal layer on a surface thereof.

SUMMARY

This disclosure is a substrate processing method for processing a substrate having a metal layer on a surface thereof, and the method includes a metal oxide layer forming step of forming a metal oxide layer formed of one atomic layer or several atomic layers on a surface layer of the metal layer by supplying an oxidizing fluid to the surface of the substrate, and a metal oxide layer removing step of selectively removing the metal oxide layer from the surface of the substrate by supplying an etchant to the surface of the substrate.

BRIEF DESCRIPTION OF THE DRAWINGS

The foregoing and other objects, features and effects of the disclosure will become apparent from the following description of embodiments with reference to the accompanying drawings.

FIGS. 8A-8E are schematic views for describing a variation in a surface state of the substrate when an oxidizing fluid supplying step and an etchant supply step are executed in the substrate processing.

DESCRIPTION OF THE EMBODIMENTS

Figure 1:
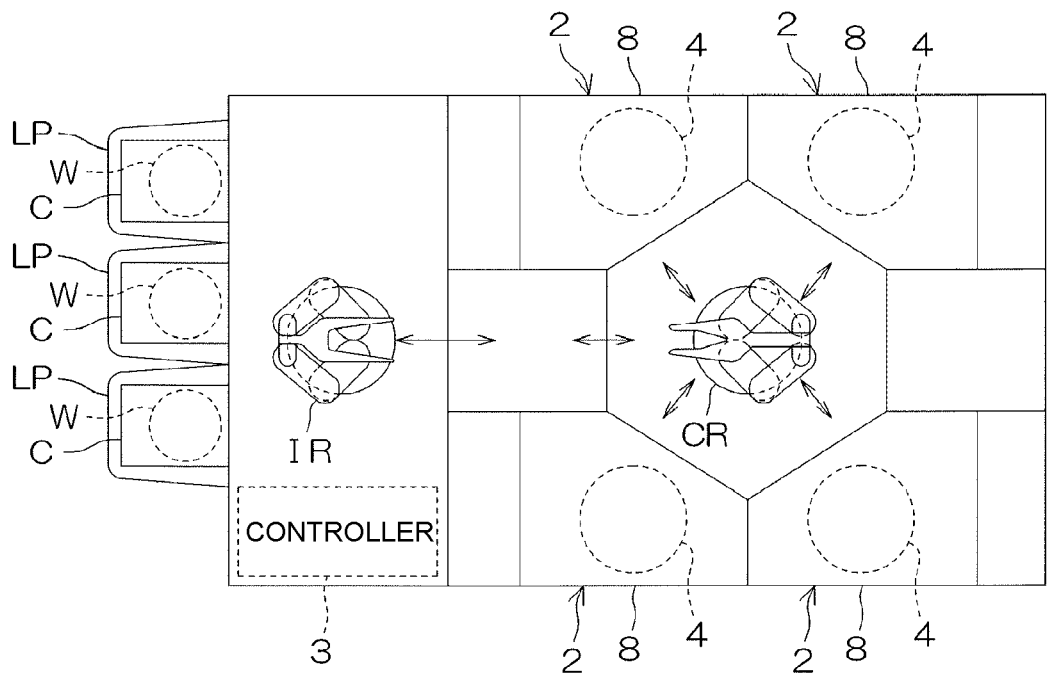
FIG. 1 is a schematic plan view for describing a layout inside a substrate processing apparatus according to one embodiment of the disclosure.

FIG. 1 is a schematic plan view for describing a layout inside a substrate processing apparatus 1 according to one embodiment of the disclosure. The substrate processing apparatus 1 is a single-wafer-processing type apparatus which processes substrates W such as silicon wafers one by one.

Figure 2:
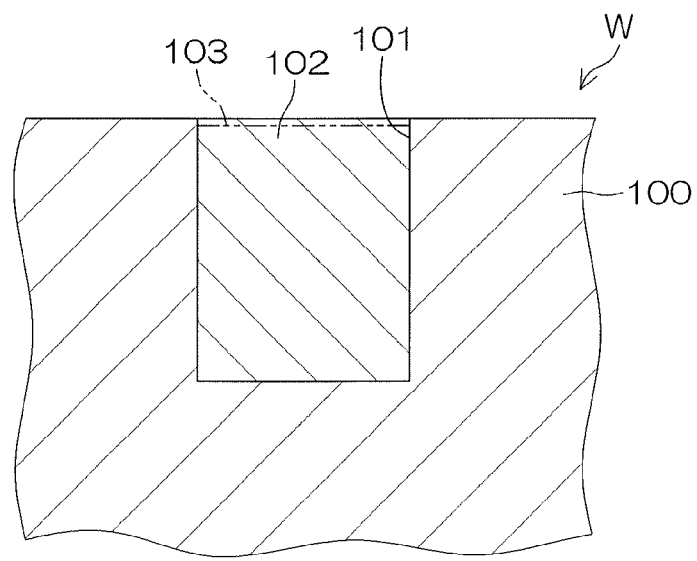
FIG. 2 is a cross-sectional view of the vicinity of a surface layer of the substrate processed by the substrate processing apparatus.

In this embodiment, the substrates W are disc-shaped substrates. The substrates W are substrates each having a surface to which chemical mechanical polishing (CMP) or the like is been applied. FIG. 2 is a cross-sectional view of the vicinity of a surface layer of the substrate W. As illustrated in FIG. 2, the substrate W includes an insulation layer 100 in which a trench 101 is formed and a copper interconnection 102 (metal layer) disposed in the trench 101 in the vicinity of the surface layer. Unlike this embodiment, the substrate W may include a flat copper film (metal layer) disposed outside the trench 101. Further, the substrate W may include a metal layer formed of a metal other than copper (for example, cobalt). In the substrate processing to be described below, a copper oxide layer 103 is formed on a surface of the copper interconnection 102.

Referring to FIG. 1, a substrate processing apparatus 1 includes a plurality of processing units 2 that process substrates W with processing liquids, load ports LP each of which a carrier C accommodating a plurality of substrates W to be processed by the processing units 2 is placed thereon, conveying robots IR and CR that convey the substrates W between the load port LP and the processing unit 2, and a controller 3 that controls the substrate processing apparatus 1.

The conveying robot IR conveys the substrates W between the carrier C and the conveying robot CR. The conveying robot CR conveys the substrates W between the conveying robot IR and the processing unit 2. The plurality of processing units 2, for example, have the same configuration. The processing liquid includes an etchant, a rinsing liquid, an organic solvent, a coating agent, and the like to be described below.

Figure 3:
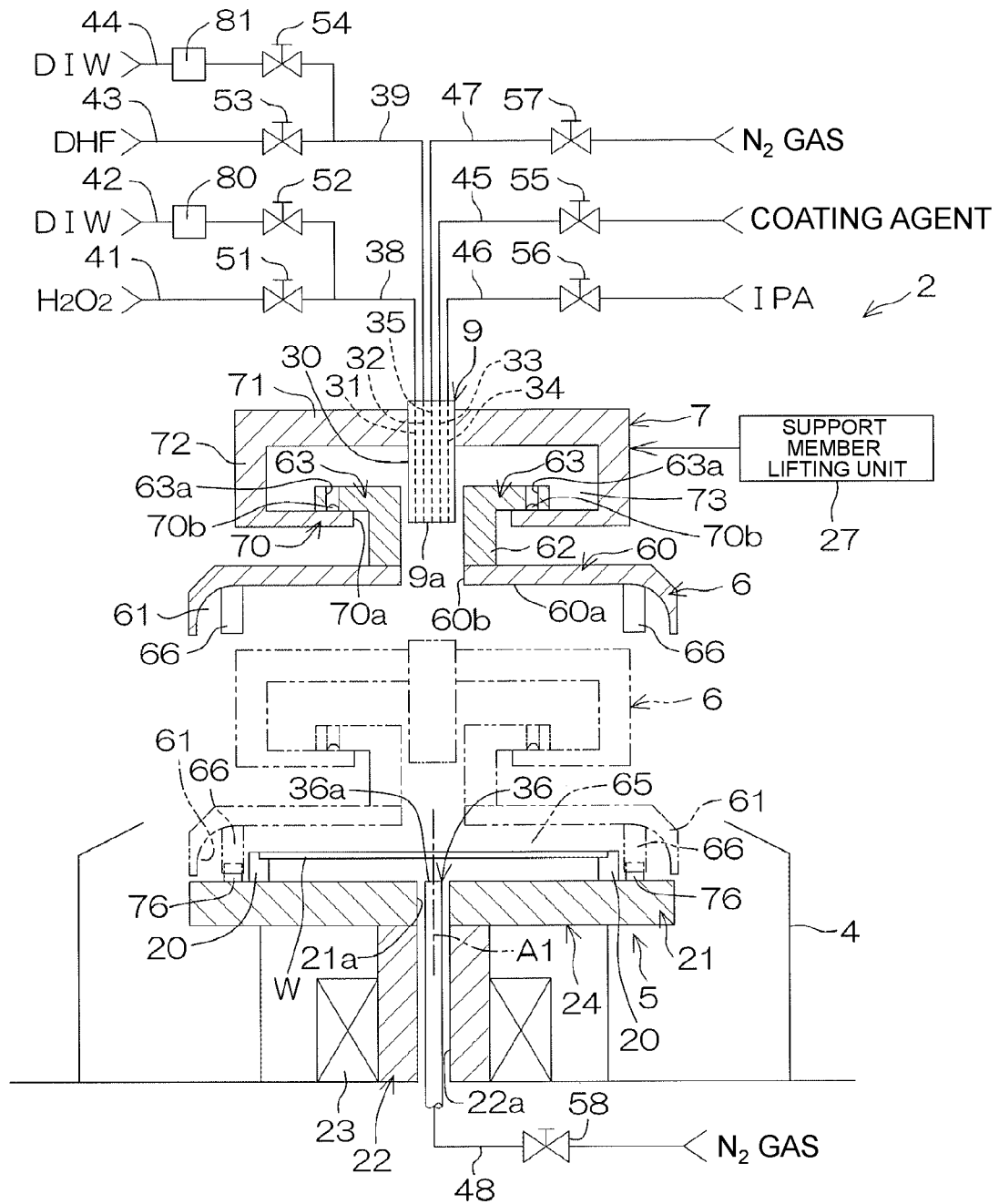
FIG. 3 is a schematic view of a processing unit provided in the substrate processing apparatus.

FIG. 3 is a schematic view for describing a configuration example of the processing unit 2. The processing unit 2 includes a spin chuck 5 that rotates the substrate W about a vertical rotation axis A1 passing through a central portion of the substrate W while horizontally holding the substrate W, a cup 4 surrounding the spin chuck 5, a facing member 6 that faces an upper surface of the substrate W held by the spin chuck 5, and a support member 7 that suspends and supports the facing member 6.

The processing unit 2 includes a chamber 8 (see FIG. 1) that accommodates the cup 4. The chamber 8 includes a doorway (not illustrated) formed therein through which the substrate W is loaded into the chamber 8 and the substrate W is unloaded from the chamber 8. The chamber 8 includes a shutter unit (not illustrated) that opens and closes the doorway.

The spin chuck 5 includes a substrate holding unit 24, a rotating shaft 22, and a spin motor 23.

The substrate holding unit 24 holds the substrate W horizontally. The substrate holding unit 24 includes a spin base 21 and a plurality of chuck pins 20. The spin base 21 has a disc shape in a horizontal direction. On an upper surface of the spin base 21, the plurality of chuck pins 20 are disposed at intervals in a circumferential direction.

The rotating shaft 22 extends in a vertical direction along the rotation axis A1. An upper end portion of the rotating shaft 22 is coupled to a central portion of a lower surface of the spin base 21. A through hole 21a penetrating vertically through the spin base 21 is formed at a central region of the spin base 21 in a plan view. The through hole 21a communicates with an internal space 22a of the rotating shaft 22.

The spin motor 23 provides a rotational force to the rotating shaft 22. By the spin motor 23 rotating the rotating shaft 22, the spin base 21 is rotated. Thereby, the substrate W is rotated around the rotation axis A1. Hereinafter, a radial inner side centered at the rotation axis A1 is simply referred to as a "radial inner side," and a radial outer side centered at the rotation axis A1 is simply referred to as a "radial outer side." The spin motor 23 is included in a substrate rotating unit that rotates the substrate W around the rotation axis A1.

The facing member 6 includes a facing portion 60, an annular portion 61, a cylindrical portion 62, and a plurality of flange portions 63.

The facing portion 60 faces the upper surface of the substrate W from above. The facing portion 60 is formed in a disc shape. The facing portion 60 is disposed substantially horizontally above the spin chuck 5. The facing portion 60 includes a facing surface 60a which faces the upper surface of the substrate W. A through hole 60b penetrating vertically through the facing portion 60 is formed in a central portion of the facing portion 60.

The annular portion 61 extends downward from a circumferential edge portion of the facing portion 60. The annular portion 61 surrounds the substrate W in a plan view. An inner circumferential surface of the annular portion 61 is curved concavely to the radial outer side as it goes downward. An outer circumferential surface of the annular portion 61 extends in a vertical direction.

The cylindrical portion 62 is fixed to an upper surface of the facing portion 60. An internal space of the cylindrical portion 62 communicates with the through hole 60b of the facing portion 60. The plurality of flange portions 63 are disposed at an upper end of the cylindrical portion 62 with a space therebetween in a circumferential direction of the cylindrical portion 62. Each of the flange portions 63 extends horizontally from the upper end of the cylindrical portion 62.

As will be described in detail below, the facing member 6 can be raised and lowered with respect to the substrate holding unit 24. The facing member 6 can be engaged with the substrate holding unit 24, for example, by a magnetic force. Specifically, the facing member 6 includes a plurality of first engaging portions 66. The plurality of first engaging portions 66 extend downward from the facing portion 60 at the radial inner side of the annular portion 61.

The plurality of first engaging portions 66 are disposed with a space therebetween in a circumferential direction around the rotation axis A1.

The substrate holding unit 24 includes a plurality of second engaging portions 76 which can make concavo-convex engagement with the plurality of first engaging portions 66. The plurality of second engaging portions 76 are disposed on the upper surface of the spin base 21 at a radial outer side of the plurality of chuck pins 20 with a space therebetween in the circumferential direction around the rotation axis A1.

When the first engaging portions 66 of the facing member 6 and the corresponding second engaging portions 76 of the substrate holding unit 24 engage, the facing member 6 is rotatable integrally with the spin base 21. The spin motor 23 also functions as a facing member rotating unit that rotates the facing member 6 around the rotation axis A1. When the facing member 6 engages with the substrate holding unit 24, the annular portion 61 surrounds the substrate W from a radial outer side (lateral side) (see the two-dot chain line in FIG. 3).

The processing unit 2 further includes a central nozzle 9 facing a center of the substrate W from above. A discharge port 9a provided at a distal end of the central nozzle 9 is accommodated in the internal space of the cylindrical portion 62 of the facing member 6.

The central nozzle 9 includes a plurality of tubes 31 to 35 (a first tube 31, a second tube 32, a third tube 33, a fourth tube 34, and a fifth tube 35) which discharge fluids downward, and a tubular casing 30 surrounding the plurality of tubes 31 to 35. The plurality of tubes 31 to 35 and the casing 30 extend in the vertical direction along the rotation axis A1. The discharge port 9a of the central nozzle 9 is also a discharge port of the plurality of tubes 31 to 35.

The first tube 31 functions as an oxidizing fluid supply unit that supplies oxidizing fluids such as hydrogen peroxide ($H_2O_2$) or the like to the upper surface of the substrate W, and as a first rinsing liquid supply unit that supplies a first rinsing liquid such as deionized water (DIW) to the upper surface of the substrate W.

The oxidizing fluid discharged from the first tube 31 has oxidizing power to the extent that a copper oxide layer 103 formed of one atomic layer or several atomic layers as a metal oxide layer is formed on the surface layer of the copper interconnection 102 of the substrate W. The pH of the oxidizing fluid discharged from the first tube 31 is preferably 6 to 8, and more preferably 7. An oxidation-reduction potential of the oxidizing fluid discharged from the first tube 31 is preferably not more than that of hydrogen peroxide.

When the oxidizing fluid discharged from the first tube 31 is hydrogen peroxide water, a concentration of the hydrogen peroxide as an oxidizing agent in the oxidizing fluid is preferably 1 ppm to 100 ppm. When the oxidizing fluid discharged from the first tube 31 is hydrogen peroxide water, the first tube 31 functions as a hydrogen peroxide water supply unit.

The oxidizing fluid discharged from the first tube 31 is not limited to hydrogen peroxide water. The oxidizing fluid discharged from the first tube 31 may be a fluid containing at least one of perchloric acid ($HClO_4$), nitric acid ($HNO_3$), a mixed liquid of ammonia water and hydrogen peroxide water (SC1), ozone ($O_3$) dissolved water, oxygen ($O_2$) dissolved water, dry air, and ozone gas.

The first rinsing liquid discharged from the first tube 31 is not limited to DIW, and may be carbonated water, electrolyzed ionic water, hydrochloric acid water at a diluted concentration (for example, about 1 ppm to 100 ppm), diluted ammonia water at a diluted concentration (for example, about 1 ppm to 100 ppm), or reduced water (hydrogen water). It is preferable that the first rinsing liquid discharged from the first tube 31 be degassed.

The first tube 31 is connected to a first common pipe 38 through which both the oxidizing fluid and the first rinsing liquid pass. The first common pipe 38 is branched off into an oxidizing fluid pipe 41 in which an oxidizing fluid valve 51 is interposed, and a first rinsing liquid pipe 42 in which a first rinsing liquid valve 52 is interposed. A degassing unit 80 which degasses the first rinsing liquid is interposed into the first rinsing liquid pipe 42.

When the oxidizing fluid valve 51 is opened, the oxidizing fluid is supplied to the first tube 31 via the oxidizing fluid pipe 41 and the first common pipe 38. Then, the oxidizing fluid is continuously discharged downward from the discharge port of the first tube 31 (the discharge port 9a of the central nozzle 9).

When the first rinsing liquid valve 52 is opened, the first rinsing liquid is supplied to the first tube 31 via the first rinsing liquid pipe 42 and the first common pipe 38. Then, the first rinsing liquid is degassed by the degassing unit 80 and is continuously discharged downward from the discharge port of the first tube 31. That is, the fluid supplied from the first tube 31 is switched between the oxidizing fluid and the first rinsing liquid by the oxidizing fluid valve 51 and the first rinsing liquid valve 52.

The second tube 32 functions as an etchant supply unit that supplies an etchant such as dilute hydrofluoric acid (DHF) to the upper surface of the substrate W, and as a second rinsing liquid supply unit that supplies a second rinsing liquid such as DIW to the upper surface of the substrate W.

The etchant discharged from the second tube 32 can selectively remove the copper oxide layer 103 on the substrate W. Therefore, it is preferable to decrease dissolved oxygen in the etchant discharged from the second tube 32. Specifically, a dissolved oxygen concentration in the etchant is preferably 200 ppb or lower, and more preferably 70 ppb or lower.

The etchant discharged from the second tube 32 is not limited to dilute hydrofluoric acid. The etchant discharged from the second tube 32 may be an acidic chemical liquid such as an inorganic acid or an organic acid. The acidic chemical liquid may be a fluid containing at least one of, for example, dilute hydrofluoric acid, hydrochloric acid, acetic acid, citric acid, and glycolic acid.

The second rinsing liquid discharged from the second tube 32 is not limited to DIW, and may be carbonated water, electrolyzed ionic water, hydrochloric acid water at a diluted concentration (for example, about 1 ppm to 100 ppm), diluted ammonia water at a diluted concentration (for example, about 1 ppm to 100 ppm), or reduced water (hydrogen water). The second rinsing liquid discharged from the second tube 32 is preferably degassed.

The second tube 32 is connected to a second common pipe 39 through which both the etchant and the second rinsing liquid pass. The second common pipe 39 is branched off into an etchant pipe 43 in which an etchant valve 53 is interposed, and a second rinsing liquid pipe 44 in which a second rinsing liquid valve 54 is interposed. As will be described in detail below, a degassed etchant is supplied from an etchant supply device 10 to the etchant pipe 43. A degassing unit 81 which degasses the second rinsing liquid is interposed in the second rinsing liquid pipe 44.

When the etchant valve 53 is opened, the degassed etchant is supplied to the second tube 32 through the etchant pipe 43 and the second common pipe 39. The degassed etchant is continuously discharged downward from a discharge port of the second tube 32 (the discharge port 9a of the central nozzle 9).

When the second rinsing liquid valve 54 is opened, the second rinsing liquid is supplied to the second tube 32 through the second rinsing liquid pipe 44 and the second common pipe 39. The second rinsing liquid is degassed by the degassing unit 81 and is continuously discharged downward from the discharge port of the second tube 32. That is, the fluid supplied from the second tube 32 is switched between the etchant and the second rinsing liquid by the etchant valve 53 and the second rinsing liquid valve 54.

The third tube 33 functions as a coating agent supply unit that supplies a coating agent to the upper surface of the substrate W. The coating agent is a liquid that forms a coating film to coat and protect the upper surface of the substrate W. A coating film covering the surface of the substrate W is formed by that an organic solvent forming the coating agent is evaporated. The coating film may merely cover the surface of the substrate W or may cover the surface of the substrate W in a state that the coating film is integrated by the chemical reaction with the surface of the insulation layer 100 and the surface of the copper interconnection 102. The oxidation of the copper interconnection 102 of the substrate W may be prevented by forming the coating film.

The third tube 33 is connected to a coating agent pipe 45 in which a coating agent valve 55 is interposed. When the coating agent valve 55 is opened, the coating agent is supplied from the coating agent pipe 45 to the third tube 33 and is continuously discharged downward from a discharge port of the third tube 33 (the discharge port 9a of the central nozzle 9).

The coating agent discharged from the third tube 33 is, for example, a solution obtained by dissolving a sublimable acrylic polymer in an organic solvent. As the organic solvent for dissolving the sublimable acrylic polymer, propylene glycol ethyl ether (PGEE) (1-ethoxy-2-propanol) and the like are examples. The coating agent discharged from the third tube 33 may be a surface water repellent agent. As the surface water repellent agent, for example, a liquid obtained by dissolving an organic silane such as hexamethyldisilazane in an organic solvent, and a liquid obtained by dissolving an alkane thiol such as decanethiol in an organic solvent are examples. As the organic solvent dissolving the organic silane, propylene glycol methyl ether acetate (PGMEA) (2-acetoxy-1-methoxypropane) and the like are examples. As the organic solvent dissolving the alkane thiol, heptane and the like are examples. When the organic thiol is used, oxidation of the surface of the copper interconnection 102 is prevented by forming a thiol organic molecular layer as a coating film on the surface of the copper interconnection 102.

The fourth tube 34 functions as an organic solvent supply unit that supplies an organic solvent such as isopropyl alcohol (IPA) to the upper surface of the substrate W. The fourth tube 34 is connected to an organic solvent pipe 46 in which an organic solvent valve 56 is interposed. When the organic solvent valve 56 is opened, the organic solvent is supplied from the organic solvent pipe 46 to the fourth tube 34 and is continuously discharged downward from a discharge port of the fourth tube 34 (discharge port 9a of the central nozzle 9).

As the organic solvent discharged from the fourth tube 34, any organic solvent other than IPA may be used as long as it is miscible in both the second rinsing liquid and the coating agent. More specifically, the organic solvent discharged from the fourth tube 34 may be a liquid containing at least one of IPA, hydrofluoroether (HFE), methanol, ethanol, acetone and trans-1,2-dichloroethylene.

The fifth tube 35 discharges an inert gas such as nitrogen gas ($N_2$ gas). The fifth tube 35 is connected to a first inert gas pipe 47 in which a first inert gas valve 57 is interposed. When the first inert gas valve 57 is opened, the inert gas is supplied from the first inert gas pipe 47 to the fifth tube 35 and is continuously discharged downward from a discharge port of the fifth tube 35 (the discharge port 9a of the central nozzle 9). The inert gas discharged from the fifth tube 35 passes through the internal space of the cylindrical portion 62 of the facing member 6 and the through hole 60b of the facing portion 60, and is supplied to a space 65 between the facing surface 60a of the facing portion 60 and the upper surface of the substrate W.

The inert gas discharged from the fifth tube 35 is a gas that is inert with respect to the upper surface and patterns of the substrate W. The inert gas discharged from the fifth tube 35 is not limited to nitrogen gas, and may be a rare gas such as argon, for example.

The processing unit 2 includes a lower surface nozzle 36 that discharges an inert gas such as nitrogen gas toward a central portion of a lower surface of the substrate W. The lower surface nozzle 36 is inserted into the through hole 21a that is open at a central portion of the upper surface of the spin base 21 and the internal space 22a of the rotating shaft 22. A discharge port 36a of the lower surface nozzle 36 is exposed from the upper surface of the spin base 21. The discharge port 36a of the lower surface nozzle 36 faces the central portion of the lower surface of the substrate W from below. The lower surface nozzle 36 is connected to a second inert gas pipe 48 in which a second inert gas valve 58 is interposed.

When the second inert gas valve 58 is opened, the inert gas is supplied from the second inert gas pipe 48 to the lower surface nozzle 36 and is continuously discharged upward from the discharge port 36a of the lower surface nozzle 36. Even when the spin chuck 5 rotates the substrate W, the lower surface nozzle 36 does not rotate.

The inert gas discharged from the lower surface nozzle 36 is a gas that is inert with respect to the upper surface and patterns of the substrate W. The inert gas discharged from the lower surface nozzle 36 is not limited to nitrogen gas, and may be a rare gas such as argon, for example.

The support member 7 includes a facing member support portion 70 which supports the facing member 6, a nozzle support portion 71 provided above the facing member support portion 70 and configured to support the casing 30 of the central nozzle 9, and a wall portion 72 connecting the facing member support portion 70 and the nozzle support portion 71 and extending in the vertical direction.

A space 73 is defined by the facing member support portion 70, the nozzle support portion 71, and the wall portion 72. The facing member support portion 70 constitutes a lower wall of the support member 7. The nozzle support portion 71 constitutes an upper wall of the support member 7. The space 73 accommodates an upper end portion of the cylindrical portion 62 of the facing member 6 and the flange portions 63. The casing 30 and the nozzle support portion 71 are in close contact with each other.

The facing member support portion 70 supports (the flange portions 63 of) the facing member 6 from below. A cylindrical portion insertion hole 70a through which the cylindrical portion 62 is inserted is formed at a central portion of the facing member support portion 70. A positioning hole 63a penetrating each of the flange portions 63 in the vertical direction is formed in the flange portion 63. An engaging protrusion 70b engageable with the positioning hole 63a of the corresponding flange portion 63 is formed in the facing member support portion 70. When the engaging protrusion 70b corresponding to each positioning hole 63a is engaged, the facing member 6 is positioned with respect to the support member 7 in a rotation direction around the rotation axis A1.

The processing unit 2 includes a support member lifting unit 27 that raises and lowers the support member 7. The support member lifting unit 27 includes, for example, a ball screw mechanism (not illustrated) which raises and lowers the support member 7 and an electric motor (not illustrated) which provides a driving force to the ball screw mechanism.

The support member lifting unit 27 can position the support member 7 at a predetermined height position between an upper position (a position illustrated by a solid line in FIG. 3) and a lower position (a position illustrated in FIG. 7A to be described below). The lower position is a position at which the support member 7 is closest to the upper surface of the spin base 21 in a movable range of the support member 7. The upper position is a position at which the support member 7 is farthest from the upper surface of the spin base 21 in the movable range of the support member 7.

When the support member 7 is positioned at the upper position, the support member 7 suspends and supports the facing member 6. The support member 7 is raised and lowered by the support member lifting unit 27 to pass through an engagement position (a position illustrated by the two-dot chain line in FIG. 3) between the upper position and the lower position.

The support member 7 is lowered together with the facing member 6 from the upper position to the engagement position. When the support member 7 reaches the engagement position, the facing member 6 is transferred to the substrate holding unit 24. When the support member 7 reaches below the engagement position, the support member 7 is separated from the facing member 6. When the support member 7 rises from the lower position and reaches the engagement position, the support member 7 receives the facing member 6 from the substrate holding unit 24. The support member 7 is raised together with the facing member 6 from the engagement position to the upper position. In this manner, the facing member 6 is raised and lowered with respect to the substrate holding unit 24 by that the support member 7 is raised and lowered by the support member lifting unit 27. Therefore, the support member lifting unit 27 functions as a facing member lifting unit.

Figure 4:
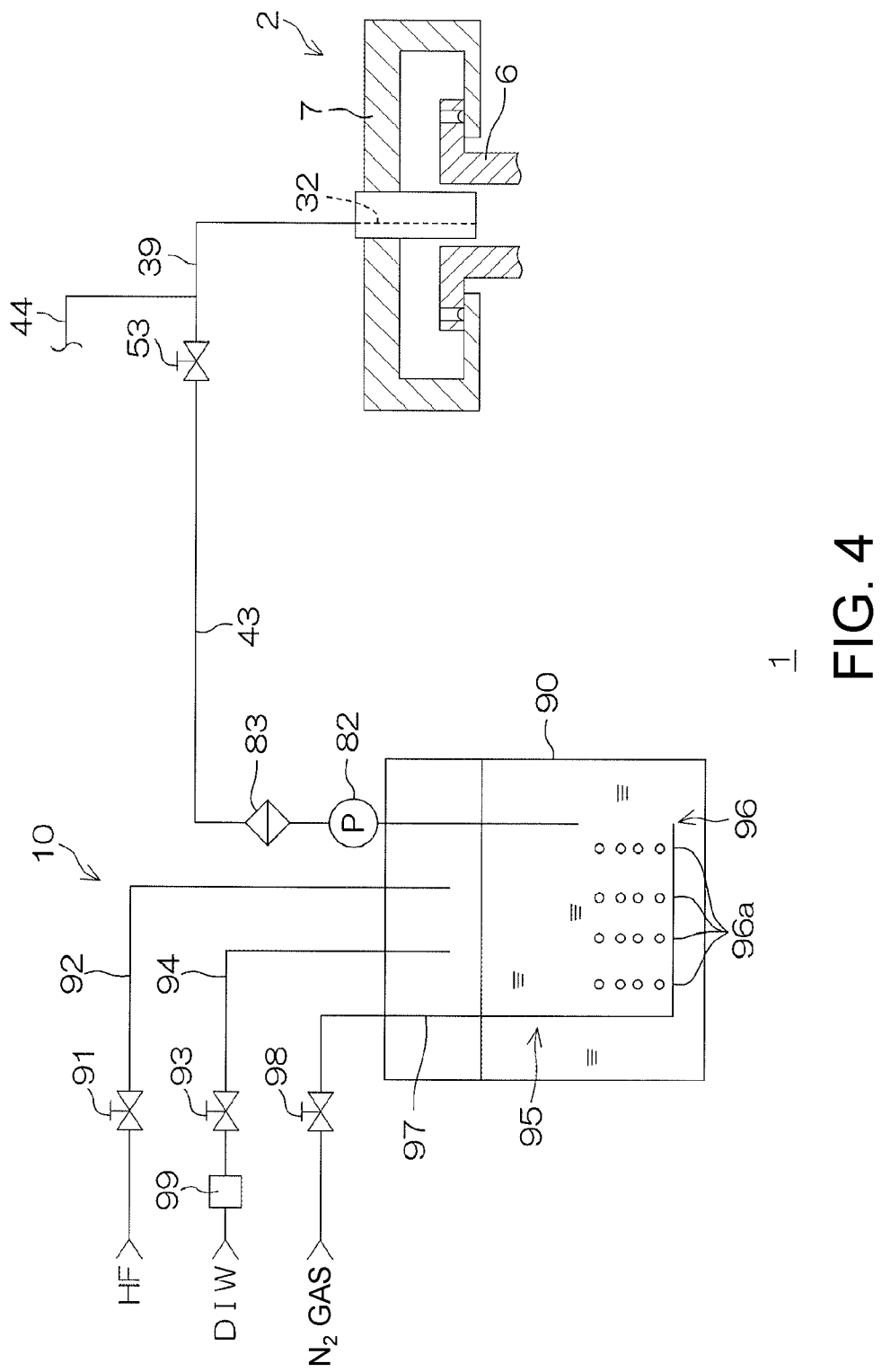
FIG. 4 is a schematic view of an etchant supply device provided in the substrate processing apparatus.

FIG. 4 is a schematic view of the etchant supply device 10 included in the substrate processing apparatus 1. The etchant supply device 10 supplies an etchant to the etchant pipe 43. The etchant supply device 10 includes an etchant tank 90 which stores an etchant such as dilute hydrofluoric acid, a neat liquid supply pipe 92 in which a neat liquid valve 91 is interposed, a DIW supply pipe 94 in which a DIW valve 93 is interposed, and a bubbling unit 95. In addition to the DIW valve 93, a degassing unit 99 may be interposed into the DIW supply pipe 94.

The neat liquid supply pipe 92 supplies a neat liquid such as hydrofluoric acid (HF) or the like from a stock liquid (undiluted liquid) supply source to the etchant tank 90. The DIW supply pipe 94 supplies DIW for thinning the stock liquid to the etchant tank 90. A concentration of the etchant in the etchant tank 90 is increased by the neat liquid supplied from the stock liquid supply pipe 92, the concentration of the etchant in the etchant tank 90 is decreased by the DIW supplied from the DIW supply pipe 94, and thereby the etchant in the etchant tank 90 can be adjusted to a desired concentration.

The bubbling unit 95 degasses the etchant in the etchant tank 90 by sending an inert gas such as nitrogen gas into the etchant in the etchant tank 90.

The bubbling unit 95 includes an inert gas nozzle 96 extending horizontally below a liquid surface of the etchant in the etchant tank 90, an inert gas supply pipe 97 supplying an inert gas to the inert gas nozzle 96, and an inert gas valve 98 interposed into the inert gas supply pipe 97. The inert gas nozzle 96 includes a plurality of discharge ports 96a aligned in a direction in which the inert gas nozzle 96 extends (in a substantially horizontal direction).

When the inert gas valve 98 is opened, the inert gas is supplied from the inert gas supply source to the inert gas nozzle 96 through the inert gas supply pipe 97. The inert gas is discharged into the etchant in the etchant tank 90 from the plurality of discharge ports 96a of the inert gas nozzle 96. The etchant in the etchant tank 90 is degassed by the inert gas discharged into the etchant in the etchant tank 90 (degassing step). When the inert gas is nitrogen gas, a discharge amount of the nitrogen gas from the inert gas nozzle 96 is preferably 70 L/min or more.

The degassed etchant is sent to the second tube 32 by a pump 82 interposed in the etchant pipe 43. At that time, the degassed etchant is filtered by passing through a filter 83 interposed in the etchant pipe 43.

Figure 5:
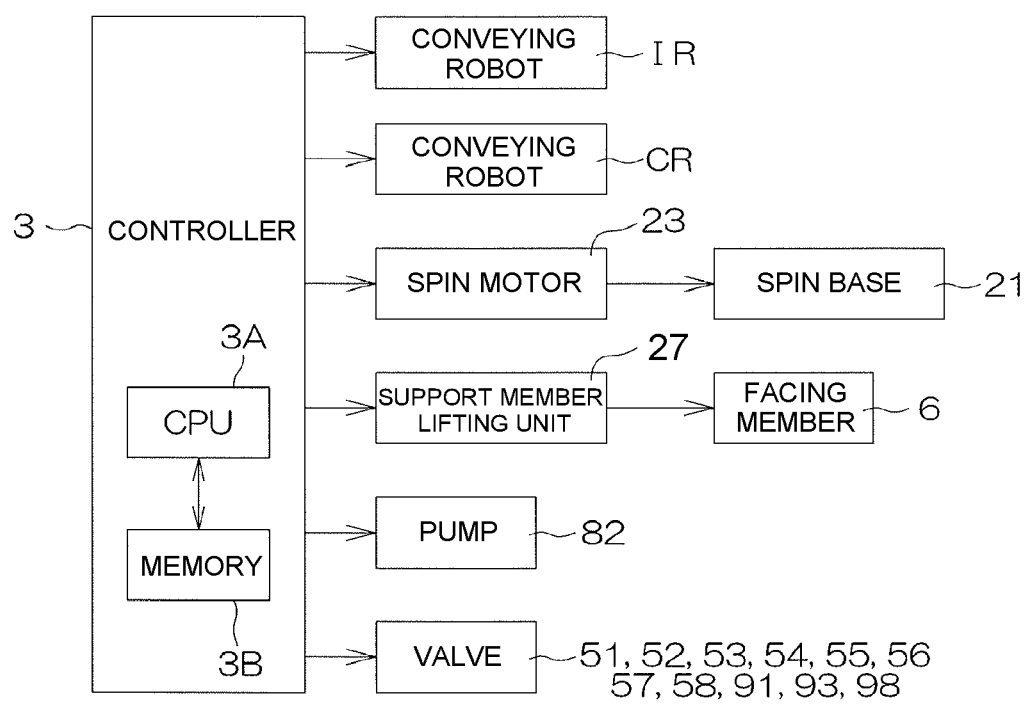
FIG. 5 is a block diagram for describing an electrical configuration of a main portion of the substrate processing apparatus.

FIG. 5 is a block diagram for describing an electrical configuration of a main portion of the substrate processing apparatus 1. The controller 3 includes a microcomputer, and controls the control objects provided in the substrate processing apparatus 1 according to a predetermined program. More specifically, the controller 3 includes a processor (CPU) 3A and a memory 3B in which a program is stored, and is configured to execute various controls for substrate processing by the processor 3A executing the program.

Particularly, the controller 3 controls operations of the conveying robots IR and CR, the spin motor 23, the support member lifting unit 27, the pump 82, the valves 51 to 58, 91, 93, and 98, and the like. By controlling the valves 51 to 58, 91, 93 and 98, corresponding nozzles or tubes are controlled to discharge or not to discharge the fluid.

Figure 6:
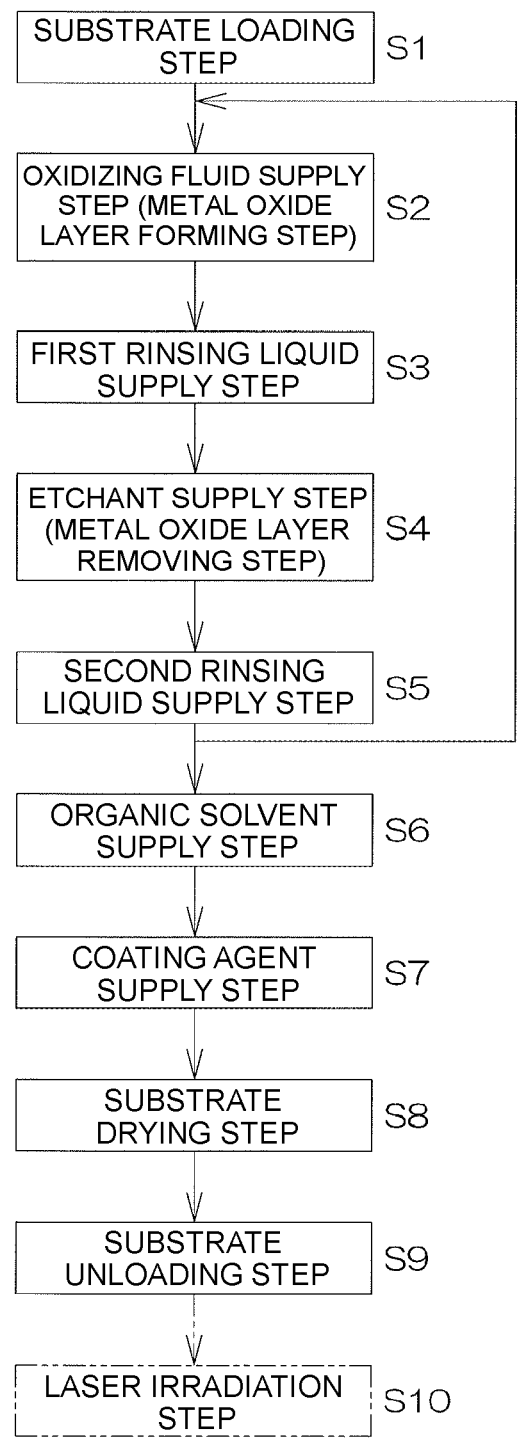
FIG. 6 is a flow chart for describing an example of substrate processing by the substrate processing apparatus.

FIG. 6 is a flow chart for describing an example of substrate processing by the substrate processing apparatus 1, mainly showing the processing realized by the controller 3 executing the program. FIGS. 7A to 7E are schematic sectional views for describing an example of substrate processing.

As shown in FIG. 6, in the substrate processing by the substrate processing apparatus 1, for example, a substrate loading step (S1), an oxidizing fluid supply step (S2), a first rinsing liquid supply step (S3), an etchant supply step (S4), a second rinsing liquid supply step (S5), an organic solvent supply step (S6), a coating agent supply step (S7), a substrate drying step (S8), and a substrate unloading step (S9) are executed in this order.

The organic solvent supply step (S6) is not immediately executed after the second rinsing liquid supply step (S5), but the oxidizing fluid supply step (S2) to the second rinsing liquid supply step (S5) are repeated a predetermined number of times.

In the description below, substrate processing by the substrate processing apparatus 1 will be described in detail.

First, before the substrate W is loaded into the processing unit 2, a relative position between the facing member 6 and the substrate holding unit 24 in a rotation direction is adjusted so that the facing member 6 and the substrate holding unit 24 can be engaged. Specifically, in a plan view, the position of the substrate holding unit 24 in the rotation direction is adjusted by the spin motor 23 so that the first engaging portions 66 of the facing member 6 and the second engaging portions 76 of the substrate holding unit 24 overlap.

Then, referring to FIG. 1, in the substrate processing by the substrate processing apparatus 1, the substrate W is loaded from the carrier C to the processing unit 2 by the conveying robots IR and CR and transferred to the spin chuck 5 (step S1: substrate loading step). Thereafter, the substrate W is horizontally held by the chuck pins 20 and is spaced upward from the upper surface of the spin base 21 (substrate holding step) until the substrate W is unloaded by the conveying robot CR.

Figure 7A:
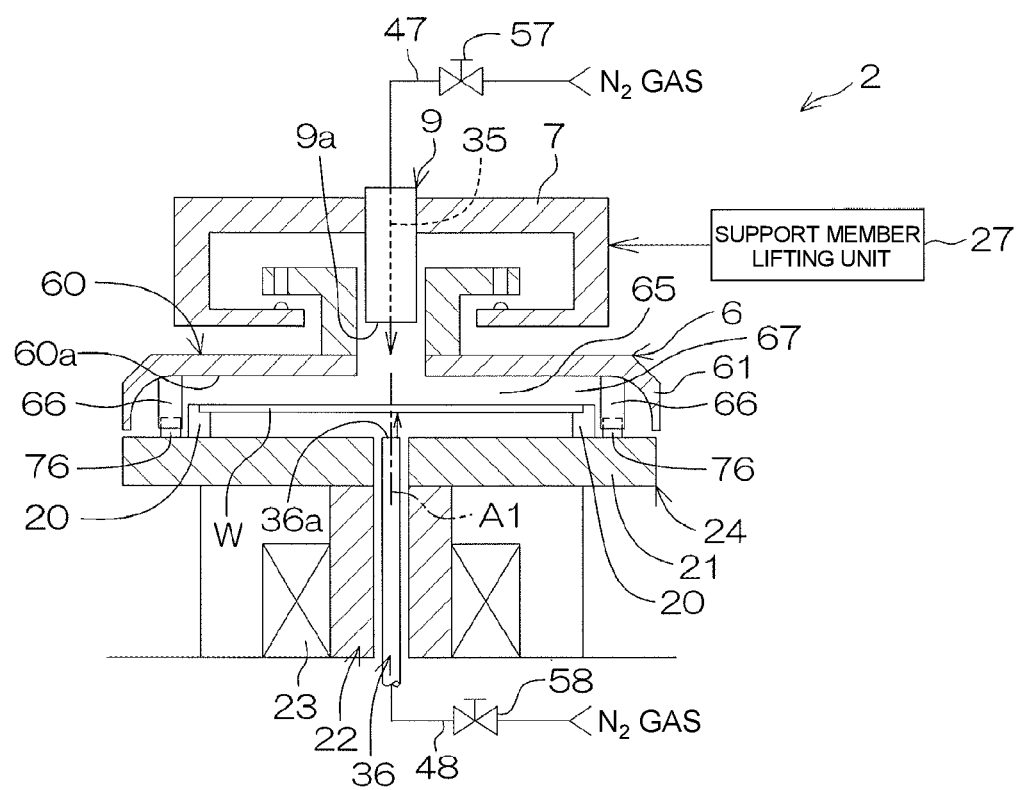
FIGS. 7A to 7E are schematic sectional views for describing the substrate processing.

Then, as illustrated in FIG. 7A, the support member lifting unit 27 lowers the support member 7 positioned at the upper position to the lower position. The support member 7 passes through the engagement position before reaching the lower position. When the support member 7 passes through the engagement position, the facing member 6 and the substrate holding unit 24 are engaged by a magnetic force. As a result, the facing member 6 is disposed at a position at which the annular portion 61 surrounds the substrate W from a radial outer side (lateral side) by the support member lifting unit 27 (facing member disposing step). Thereby, the substrate W is accommodated in an accommodating space 67 defined by the facing member 6 and the spin base 21. The space 65 between the upper surface of the substrate W and the facing surface 60a of the facing portion 60 is a portion of the accommodating space 67.

Then, the first inert gas valve 57 is opened. Thereby, an inert gas such as nitrogen gas (N₂ gas) is supplied from the fifth tube 35 toward the upper surface of the substrate W. Then, the second inert gas valve 58 is opened. Thereby, an inert gas such as nitrogen gas (N₂ gas) is supplied from the lower surface nozzle 36 toward the lower surface of the substrate W. The nitrogen gas supplied toward the lower surface of the substrate W is introduced around the upper surface side of the substrate W. Therefore, the nitrogen gas discharged from the lower surface nozzle 36 is eventually supplied to the space 65. As a result, an atmosphere in the entire accommodating space 67 is replaced with an inert gas, and as a result, an atmosphere in the space 65 is replaced with an inert gas (replacement step). That is, an oxygen concentration in the space 65 decreases. In this manner, the fifth tube 35 and the lower surface nozzle 36 function as an inert gas supply unit that supplies an inert gas to the space 65.

Figure 7B:
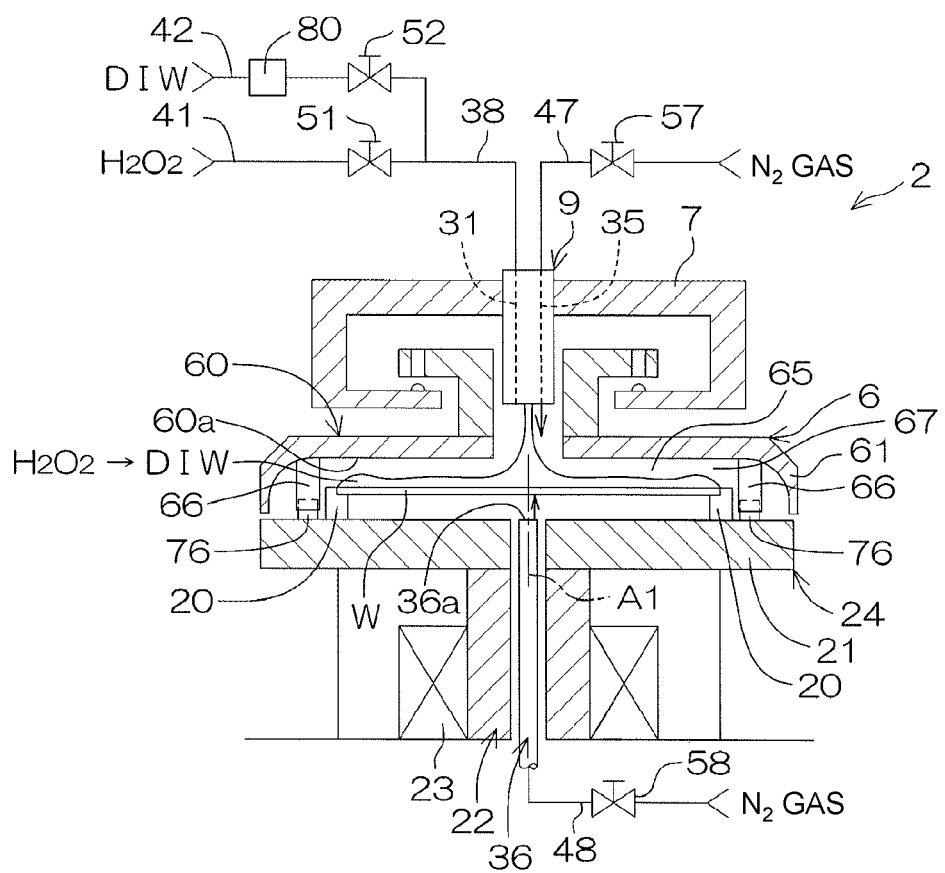
Figure 7C:
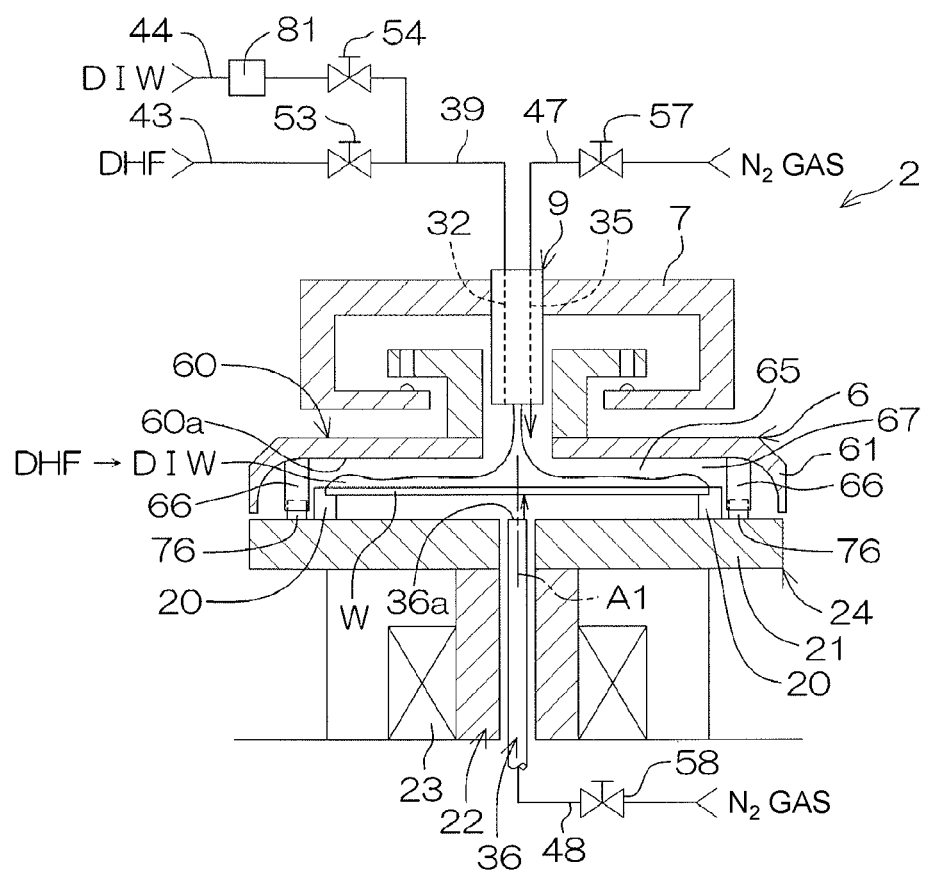

Next, referring to FIG. 7B, the oxidizing fluid valve 51 is opened. As a result, an oxidizing fluid such as hydrogen peroxide water (H₂O₂) is supplied (discharged) from the first tube 31 toward a central region of the upper surface of the substrate W (step S2: oxidizing fluid supply step). By supplying an oxidizing fluid to the upper surface of the substrate W, the copper interconnection 102 (see FIG. 2) of the substrate W is oxidized. As a result, the copper oxide layer 103 (see FIG. 2) is formed (metal oxide layer forming step).

The oxidizing fluid spreads over the entire upper surface of the substrate W by a centrifugal force. The oxidizing fluid on the substrate W scatters outward in a radial direction from the substrate W by the centrifugal force and is received by the cup 4.

After the supply of the oxidizing fluid to the upper surface of the substrate W is continued for a predetermined time (for example, 10 seconds), the oxidizing fluid valve 51 is closed. On the other hand, the first rinsing liquid valve 52 is opened. As a result, the first rinsing liquid such as DIW is supplied (discharged) from the first tube 31 toward the central region of the upper surface of the substrate W (step S3: first rinsing liquid supply step). The first rinsing liquid discharged from the first tube 31 is a first rinsing liquid degassed by the degassing unit 80 interposed in the first rinsing liquid pipe 42 (degassed first rinsing liquid supply step).

The first rinsing liquid spreads over the entire upper surface of the substrate W by the centrifugal force. As a result, the oxidizing fluid on the substrate W is washed away by the first rinsing liquid. The oxidizing fluid and the first rinsing liquid on the substrate W scatter outward in a radial direction from the substrate W by the centrifugal force, and are received by the cup 4.

After the supply of the first rinsing liquid to the upper surface of the substrate W is continued for a predetermined time (for example, 10 seconds), the first rinsing liquid valve 52 is closed. Then, referring to FIG. 7C, the etchant valve 53 is opened. As a result, an etchant such as dilute hydrofluoric acid (DHF) is supplied (discharged) from the second tube 32 toward the central region of the upper surface of the substrate W (step S4: etchant supply step). By supplying the etchant to the upper surface of the substrate W, the copper oxide layer 103 (see FIG. 2) of the substrate W is selectively removed (metal oxide layer removing step). That is, a portion oxidized to the copper oxide layer 103 by the oxidizing fluid in the copper interconnection 102 of the substrate W are selectively removed.

The etchant discharged from the second tube 32 is an etchant that has already been degassed by the bubbling unit 95 (degassed etchant supply step). When the etchant is discharged from the second tube 32, the atmosphere in the accommodating space 67 (space 65) has already been replaced by an inert gas. That is, the etchant is supplied to the upper surface of the substrate W while maintaining a dissolved oxygen concentration at the time of degassing. The dissolved oxygen concentration in the etchant is preferably 200 ppb or lower, and more preferably 70 ppb or lower. In this manner, an etchant having such an extremely low dissolved oxygen concentration is supplied to the upper surface of the substrate W. The copper oxide layer 103 is more selectively removed by the etchant.

The etchant deposited on the upper surface of the substrate W spreads over the entire upper surface of the substrate W by the centrifugal force. Thereby, the first rinsing liquid on the substrate W is replaced with the etchant. The oxidizing fluid and the first rinsing liquid on the substrate W scatter outward in a radial direction from the substrate W by the centrifugal force, and are received by the cup 4.

After the supply of the etchant to the upper surface of the substrate W is continued for a predetermined time (for example, 10 seconds), the etchant valve 53 is closed. On the other hand, the second rinsing liquid valve 54 is opened. As a result, the second rinsing liquid such as DIW is supplied (discharged) from the second tube 32 toward the central region on the upper surface of the substrate W (step S5: second rinsing liquid supply step). The second rinsing liquid discharged from the second tube 32 is a second rinsing liquid degassed by the degassing unit 81 interposed in the second rinsing liquid pipe 44 (degassed second rinsing liquid supply step).

The second rinsing liquid spreads over the entire upper surface of the substrate W by the centrifugal force. Thereby, the etchant on the substrate W is washed away by the second rinsing liquid. The etchant and the second rinsing liquid on the substrate W scatter outward in a radial direction from the substrate W by the centrifugal force, and are received by the cup 4.

After the supply of the second rinsing liquid to the upper surface of the substrate W is continued for a predetermined time (for example, 10 seconds), the second rinsing liquid valve 54 is closed. Then, referring again to FIG. 7B, the oxidizing fluid valve 51 is opened. Thereby, the oxidizing fluid supply step (S2) is executed. Thereafter, the first rinsing liquid supply step (S3), the etchant supply step (S4), and the second rinsing liquid supply step (S5) are executed. After the oxidizing fluid supply step (S2) to the second rinsing liquid supply step (S5) have been executed a predetermined number of times, that is, after the last second rinsing liquid supply step (S5), the organic solvent supply step (S6) and subsequent steps are executed. By executing the oxidizing fluid supply step (S2) to the second rinsing liquid supply step (S5) once, the metal oxide layer forming step and the metal oxide layer removing step are executed once (one cycle).

Figure 7D:
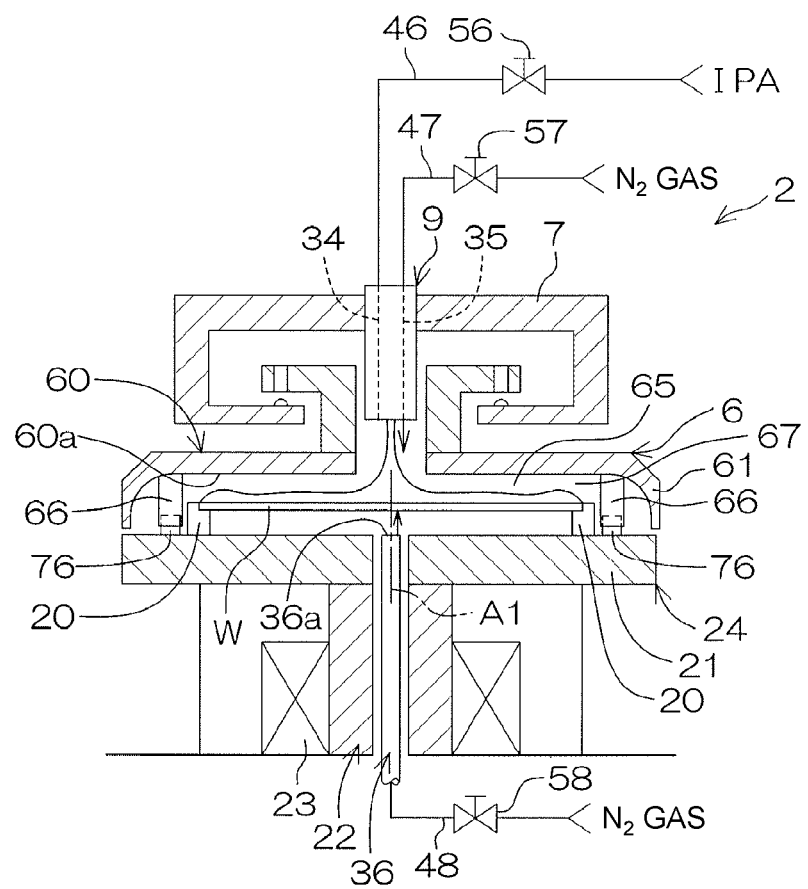

Specifically, the second rinsing liquid valve 54 is closed, and instead thereof the organic solvent valve 56 is opened as illustrated in FIG. 7D. As a result, an organic solvent such as IPA is supplied (discharged) from the fourth tube 34 toward the central region of the upper surface of the substrate W (step S6: organic solvent supply step).

The organic solvent spreads over the entire upper surface of the substrate W by the centrifugal force. The organic solvent is mixed with the second rinsing liquid. Therefore, the second rinsing liquid on the substrate W is excluded from the substrate W together with the newly supplied organic solvent. As a result, the second rinsing liquid on the substrate W is replaced with the organic solvent. The second rinsing liquid and the organic solvent on the substrate W scatter outward in a radial direction from the substrate W by the centrifugal force, and are received by the cup 4.

Figure 7E:
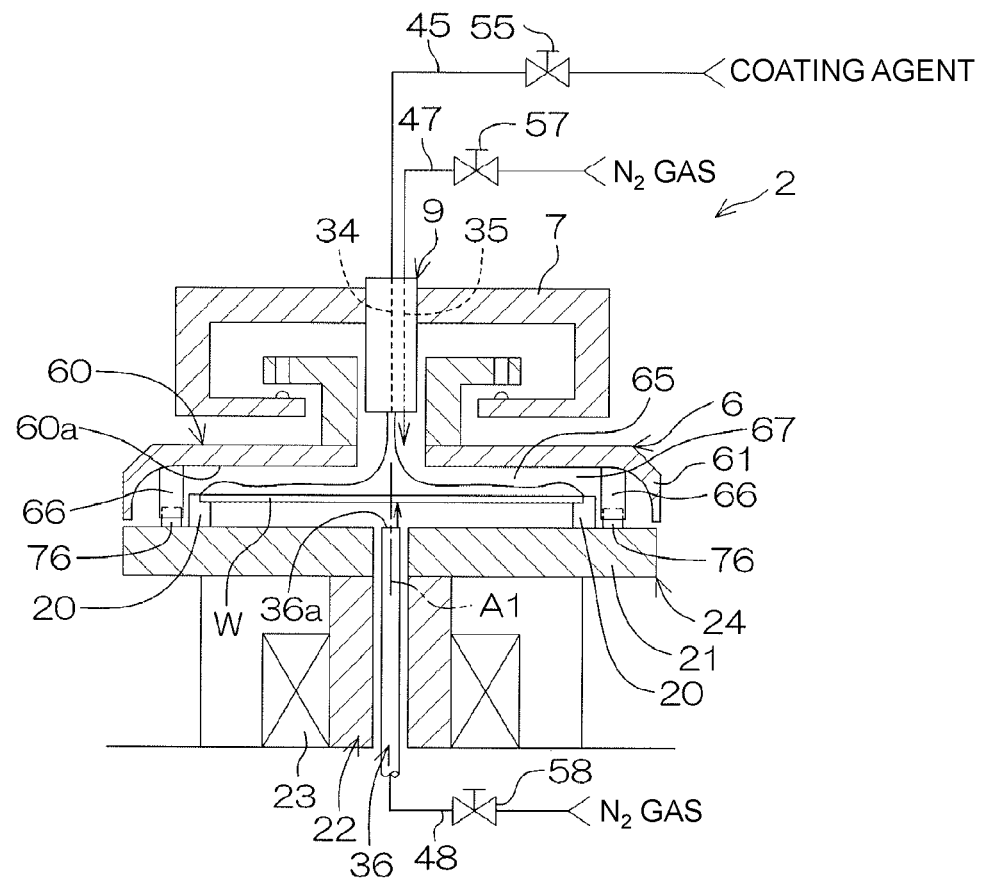

Then, the organic solvent valve 56 is closed, and instead thereof the coating agent valve 55 is opened as illustrated in FIG. 7E. As a result, a coating agent is supplied (discharged) from the third tube 33 toward the central region of the upper surface of the substrate W (step S7: coating agent supply step).

The coating agent spreads over the entire upper surface of the substrate W by the centrifugal force. The coating agent is mixed with the organic solvent. Therefore, the organic solvent on the substrate W is excluded from the substrate W together with the newly supplied coating agent. As a result, the organic solvent on the substrate W is replaced with the coating agent, and the upper surface of the substrate W is covered with the coating agent. The organic solvent and the coating agent on the substrate W scatter outward in a radial direction from the substrate W by the centrifugal force, and are received by the cup 4.

Then, the coating agent valve 55 is closed. Thereby, the supply of the coating agent to the upper surface of the substrate W is stopped. Then, a coating film is formed on the substrate W by evaporating the organic solvent in the coating agent on the substrate W. At this time, the organic solvent in the coating agent may be evaporated by heating the substrate W using a heater (not illustrated) or the like embedded in the spin base 21.

Then, the spin motor 23 rotates the substrate W at 2000 rpm, for example. As a result, liquid components on the substrate W is shaken off and the substrate W is dried (step S8: substrate drying step).

Thereafter, the spin motor 23 stops the rotation of the spin chuck 5. Then, the first inert gas valve 57 and the second inert gas valve 58 are closed. Then, the support member lifting unit 27 moves the support member 7 to the upper position. Thereafter, referring to FIG. 1, the conveying robot CR enters the processing unit 2, takes up the processed substrate W from the spin chuck 5, and unloads the processed substrate W out of the processing unit 2 (step S9: substrate unloading step). The substrate W is transferred from the conveying robot CR to the conveying robot IR, and is stored in the carrier C by the conveying robot IR.

According to this embodiment, the copper oxide layer 103 (metal oxide layer) formed of one atomic layer or several atomic layers is formed on the surface layer of the copper interconnection 102 (metal layer) by supplying an oxidizing fluid such as a hydrogen peroxide water or the like to the surface of the substrate W illustrated in FIGS. 8A and 8B (metal oxide layer forming step). Then, the copper oxide layer 103 is selectively removed from the surface of the substrate W by supplying an etchant such as dilute hydrofluoric acid to the surface of the substrate W as illustrated n FIGS. 8C and 8D (metal oxide layer removing step).

In the metal oxide layer forming step, the copper oxide layer 103 formed of one atomic layer or several atomic layers is formed. A thickness of the one atomic layer of the copper and the copper oxide is 1 nm or less (for example, 0.3 nm to 0.4 nm). Therefore, in the metal oxide layer removing step, an etching amount of the metal layer can be controlled with an accuracy of nanometers or smaller by selectively removing the copper oxide layer 103. The etching amount is also called a recess amount and is also called an etching depth.

According to this embodiment, the metal oxide layer forming step and the metal oxide layer removing step are alternately executed a plurality of times. A thickness of the copper interconnection 102 that is oxidized by executing the metal oxide layer forming step and the metal oxide layer removing step once is substantially constant. That is, self-aligned oxidation of the copper interconnection 102 is achieved. Therefore, the thickness (etching amount D1) of the copper interconnection 102 etched is substantially constant (see FIG. 8C). Accordingly, a desired etching amount D2 as illustrated in FIG. 8E can be achieved by adjusting the number of repetitive executions of the metal oxide layer forming step and the metal oxide layer removing step.

In this manner, stepwise etching of the copper interconnection 102 with a constant etching amount is called digital etching. Further, etching of the metal layer (copper interconnection 102) by repeatedly executing the metal oxide layer forming step and the metal oxide layer removing step is called cycle etching.

A thickness of the copper oxide layer 103 formed in the metal oxide layer forming step depends on oxidizing power of the oxidizing fluid. The higher the pH, that is, the higher the basicity, the higher the oxidizing power of the oxidizing fluid. Since the pH of hydrogen peroxide water is 6 to 8, hydrogen peroxide water has oxidizing power suitable for forming the copper oxide layer 103 of one atomic layer to several atomic layers. Accordingly, if a method of supplying hydrogen peroxide water to the surface of the substrate W is used to form the copper oxide layer 103, the copper oxide layer 103 having a thickness of a nanometer or less can be formed.

Further, according to this embodiment, in the metal oxide layer removing step, the degassed etchant is supplied from the second tube 32 (etchant supply unit) to the surface of the substrate W (degassed etchant supply step).

When a dissolved oxygen concentration in the etchant is high, there is a concern that the copper interconnection 102 on the surface of the substrate W may be oxidized by oxygen in the etchant and becomes a copper oxide layer 103. In this case, portions of the copper interconnection 102 that have not been oxidized by the oxidizing fluid may be also etched by the etchant. That is, selectivity of removal of the copper oxide layer 103 decreases (an etching amount changes). By using the degassed etchant, selectivity of oxidation by the etchant can be improved. Therefore, the etching amount can be controlled with high accuracy.

Further, according to this embodiment, the etchant in the etchant tank 90 is degassed by sending an inert gas to the etchant in the etchant tank 90 (degassing step). Then, the degassed etchant supply step includes a step of supplying the etchant degassed by the degassing step to the surface of the substrate W.

According to this method, the etchant in the etchant tank 90 can be degassed by sending an inert gas from the bubbling unit 95 to the etchant in the etchant tank 90. Thereby, the dissolved oxygen concentration in the etchant is sufficiently decreased. Accordingly, in the degassed etchant supply step, the etchant that has been sufficiently decreased in dissolved oxygen concentration can be supplied to the upper surface of the substrate W.

Further, according to this embodiment, the degassed etchant supply step includes a step of supplying the degassed etchant to the surface of the substrate W while maintaining the dissolved oxygen concentration of the degassed etchant. There is a concern that oxygen present in the atmosphere around the etchant may be dissolved in the etchant before the etchant supplied to the surface of the substrate W reacts with the copper oxide layer 103 on the surface of the substrate W. Therefore, the selectivity of removal of the copper oxide layer 103 can be improved by supplying the etchant to the surface of the substrate W while maintaining the dissolved oxygen concentration of the etchant at the time of degassing.

According to this embodiment, the atmosphere in the space 65 is replaced with an inert gas by supplying the inert gas from the fifth tube 35 and the lower surface nozzle 36 toward the space 65 between the facing portion 60 of the facing member 6 and the substrate W (replacement step). Then, after the atmosphere in the space 65 is replaced with the inert gas, the degassed etchant is discharged toward the surface of the substrate (degassed etchant discharging step) from the central nozzle 9 having the discharge port 9a that is exposed in the space 65.

In this manner, the atmosphere in the space 65 is replaced with an inert gas. That is, oxygen is excluded from the atmosphere around the upper surface of the substrate W. Therefore, it is possible to suppress or prevent oxygen dissolved in the etchant supplied to the upper surface of the substrate W from causing an increase in the dissolved oxygen. Therefore, the etchant can be supplied to the surface of the substrate W while maintaining the dissolved oxygen concentration immediately after degassing.

Further, according to this embodiment, the facing member 6 is disposed so that the annular portion 61 of the facing member 6 surrounds the substrate W from a radial outer side (lateral side) (facing member disposing step). Then, the facing member disposing step is executed before starting the replacement step.

By surrounding the substrate W by the annular portion 61 from the radial outer side, a degree of airtightness of the space 65 can be enhanced. Therefore, after the atmosphere in the space 65 is replaced with an inert gas, an inflow of oxygen from the outside into the space 65 is suppressed. Accordingly, the etchant maintaining the dissolved oxygen concentration immediately after degassing can be supplied to the surface of the substrate W.

Further, in this embodiment, the first rinsing step is executed between the metal oxide layer forming step and the metal oxide layer removing step. When the etchant is supplied to the upper surface of the substrate W in a state in which the oxidizing fluid remains on the upper surface of the substrate W, there is a concern that the copper interconnection 102 newly exposed due to removal of the copper oxide layer 103 may be oxidized by the oxidizing fluid remaining on the upper surface of the substrate W. In this case, the etching amount may be changed. Therefore, by washing away the oxidizing fluid on the substrate W by the first rinsing liquid such as DIW, the etching amount can be controlled with high accuracy.

According to this embodiment, in the first rinsing step, the degassed first rinsing liquid is supplied to the upper surface of the substrate W (degassed rinsing liquid supply step). Even though the oxidizing fluid is washed away by the first rinsing liquid, there is a concern that the copper interconnection 102 newly exposed due to removal of the copper oxide layer 103 may be oxidized by dissolved oxygen in the first rinsing liquid. Therefore, by using the degassed first rinsing liquid, the oxidation of the newly exposed copper interconnection 102 due to removal of the copper oxide layer 103 can be suppressed.

In this embodiment, the second rinsing step is executed after the metal oxide layer removing step. When the etchant remains on the upper surface of the substrate W after removing the copper oxide layer 103, oxygen in the atmosphere around the upper surface of the substrate W is newly dissolved in the etchant. Therefore, there is a concern that the copper interconnection 102 newly exposed due to removal of the copper oxide layer 103 by the etchant may be oxidized by this oxygen. This may decrease the selectivity of removal of the copper oxide layer 103. Therefore, by washing away the etchant that is adhered to the upper surface of the substrate W by the second rinsing liquid, the etching amount can be controlled with high accuracy.

Further, according to this embodiment, the substrate W includes the insulation layer 100 in which the trench 101 is formed, and the copper interconnection 102 (metal interconnection) disposed in the trench 101. The width of the copper interconnection 102 is easily affected by miniaturization. Even in such a case, etching of the copper interconnection 102 can be controlled with an accuracy of nanometers or smaller.

Further, in the embodiment, a coating film forming step is executed after the last second rinsing liquid supply step (also after the last metal oxide layer removing step has ended). After the last second rinsing liquid supply step, there is a concern that the copper interconnection 102 on the upper surface of the substrate W may be oxidized by oxygen or moisture in the atmosphere around the substrate W. Therefore, the copper interconnection 102 can be protected by forming the coating film covering the upper surface of the substrate W.

Figure 9:
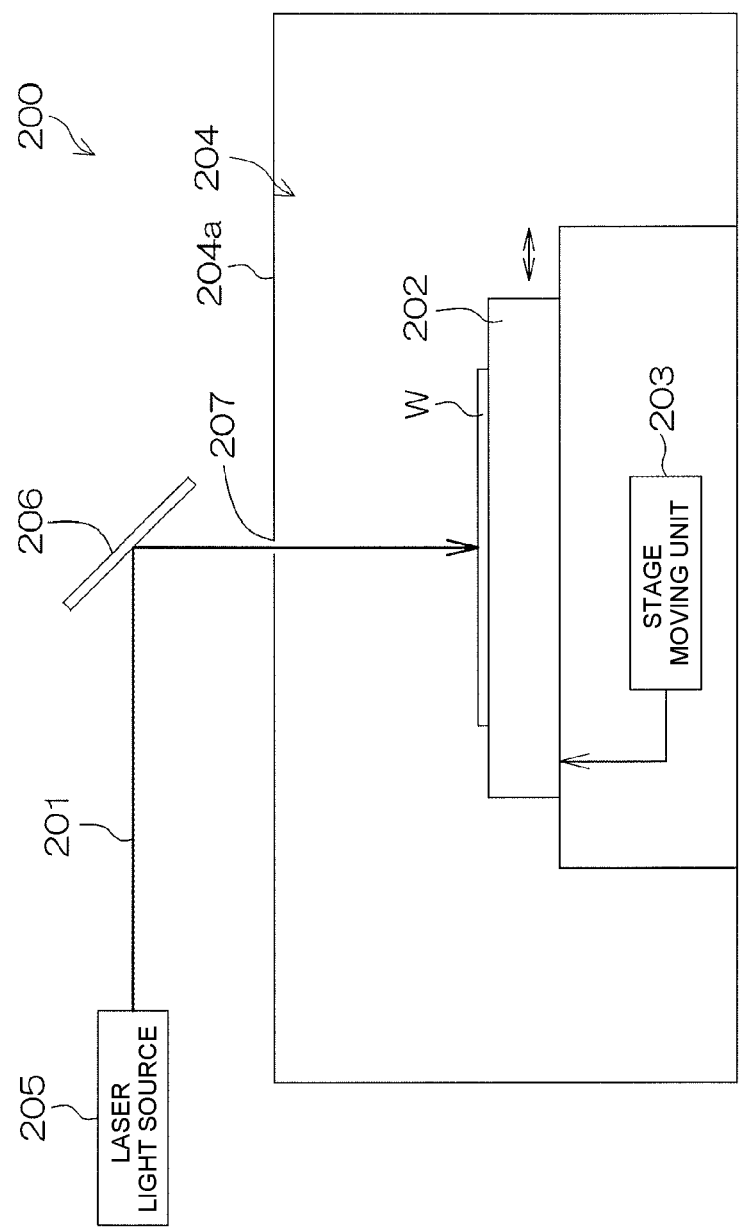
FIG. 9 is a schematic view of a laser light irradiation apparatus which irradiates a surface of the substrate with laser light.

After substrate processing by the substrate processing apparatus 1 is executed, laser thermal anneal (LTA) processing is executed on the upper surface of the substrate W using a laser processing apparatus 200 illustrated in FIG. 9. FIG. 9 is a schematic view of the laser processing apparatus 200.

The laser processing apparatus 200 is an apparatus different from the substrate processing apparatus 1. The laser processing apparatus 200 includes a stage 202 on which a substrate W is mounted, a stage moving unit 203 which moves the stage 202 in a horizontal direction, a processing chamber 204 which accommodates the stage 202, a laser light source 205 which generates laser 201, and a mirror 206 which reflects the laser 201.

The mirror 206 is disposed above a ceiling portion 204a of the processing chamber 204. A slit 207 for introducing the laser 201, reflected by the mirror 206 and directed downward, into the processing chamber 204 is formed in the ceiling portion 204a. Although only one mirror 206 is illustrated in this embodiment, a plurality of mirrors that reflect the laser light 201 generated from the laser light source 205 may be provided.

The laser light source 205 may be, for example, an excimer lamp. A wavelength of the laser 201 may be, for example, 308 nm of excimer laser. An energy density of the laser 201 is preferably 0.2 J/cm$^2$ or higher and 0.5 J/cm$^2$ or lower.

Next, the LTA process will be described. The substrate W on which the substrate processing is executed by the substrate processing apparatus 1 is conveyed to the processing chamber 204 and placed on the stage 202. Then, the laser 201 is generated from the laser light source 205, and the upper surface of the substrate W is irradiated with the laser

201 (step S10: laser irradiation step, see the two-dot chain line in FIG. 6). A position of laser irradiation on the upper surface of the substrate W is changed by horizontally moving the stage 202 by the stage moving unit 203 while the upper surface of the substrate W is irradiated with the laser light 201. By performing the irradiation of the laser 201 with respect to a predetermined region on the upper surface of the substrate W, the LTA processing ends. Since the laser irradiation step is executed after the substrate processing shown in FIG. 6, the laser irradiation step is executed after the last metal oxide layer removing step ends.

By performing the laser thermal anneal (LTA) processing, the surface of the copper interconnection 102 can be melted due to irradiation of the laser 201. As a result, the surface of the copper interconnection 102 can be smoothed.

Since the copper interconnection 102 is disposed in the trench 101, it is difficult to apply chemical-mechanical polishing (CMP) to the surface of the copper interconnection 102. Even in such a case, the surface of the copper interconnection 102 can be smoothed by the LTA processing.

Even though the upper surface of the substrate W is protected by the coating film, irradiating the copper interconnection 102 with the laser 201 is possible.

In this embodiment, the laser processing apparatus 200 is described as a device different from the substrate processing apparatus 1. However, unlike this embodiment, the laser processing apparatus 200 may be provided in the substrate processing apparatus 1 as a laser irradiation unit.

The disclosure is not limited to the embodiments described above, and can be implemented by a still another embodiment.

In the aforementioned substrate processing, the oxidizing fluid supply step (S2) to the second rinsing liquid supply step (S5) are repeated a predetermined number of times. However, unlike the aforementioned embodiment, there may be cases in which the oxidizing fluid supply step (S2) to the second rinsing liquid supply step (S5) are not repeated.

In the substrate processing described above, the coating agent supply step (S6) is executed after the last second rinsing liquid supply step (S5). However, unlike the aforementioned substrate processing, the coating agent supply step (S6) may be omitted.

In the description below, using FIGS. 10 to 18, results of experiments performed to demonstrate the formation of the copper oxide layer of several atomic layers and the selective etching of the copper oxide layer described as above will be described.

In FIGS. 10 to 12B, experiments were performed to measure an etching amount after cycle etching was applied to the substrate. In this experiment, an etching amount after executing cycle etching using a single-wafer-processing type substrate cleaning apparatus (SU-3200 manufactured by SCREEN Semiconductor Solutions Co., Ltd.) was measured.

A substrate having a flat copper film grown to 500 nm by electroplating (electrochemical deposition (ECD)) on a surface thereof was used as the substrate. A natural oxide film formed on the copper film was selectively removed by processing it for 20 seconds with dilute hydrofluoric acid (dHF: hydrofluoric acid of about 0.05% concentration) having a dissolved oxygen concentration of 50 ppb or lower in an environment of 24° C. Two types of oxidizing fluids were used to compare a difference in etching amount due to the oxidizing fluids. Specifically, under an environment of room temperature, diluted hydrogen peroxide water ($dH_2O_2$) having a mass percent concentration of about 3% and diluted ammonia peroxide mixture (dAPM) having a mass percent concentration of about 1.2% were used. dAPM is a liquid in which ammonia water, hydrogen peroxide water, and DIW are mixed at a ratio of approximately 1:4:100. Whichever oxidizing fluid was used, dHF was used as the etchant.

The etching amount was calculated from a difference in thickness of the copper film measured before and after cycle etching. The thickness of the copper film was measured using a sheet resistance device (RS 100 manufactured by KLA-Tencor). Further, the etching amount for each cycle was calculated by dividing a total etching amount calculated from thicknesses of the copper film before and after cycle etching by the number of cycles.

Figure 10:
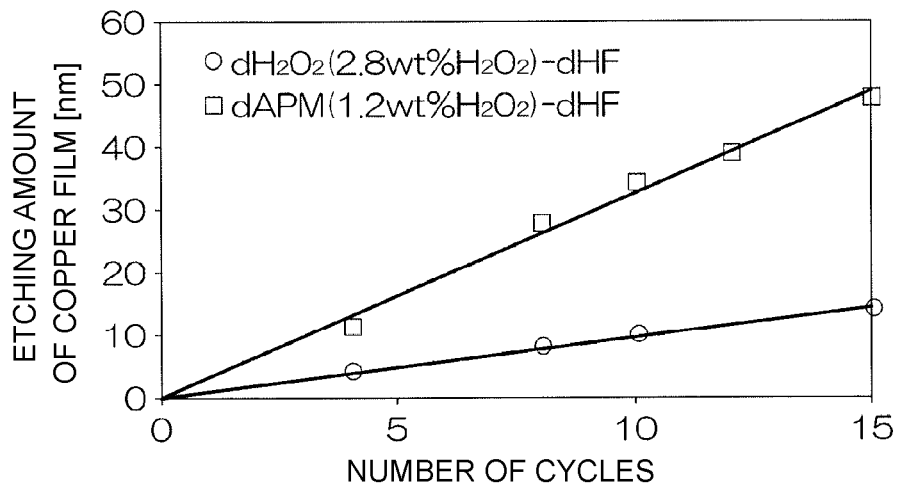
FIG. 10 is a graph showing a relationship between the number of cycles of etching and an etching amount of a copper film of the substrate.

FIG. 10 is a graph showing a relationship between the number of cycles of etching and the etching amount of the copper film of the substrate. The horizontal axis of FIG. 10 represents the number of cycles. The vertical axis in FIG. 10 represents the etching amount (total amount) of the copper film. As illustrated in FIG. 10, the etching amount of the copper film when dAPM is used and the etching amount of the copper film when $dH_2O_2$ is used were both substantially proportional to the number of cycles. However, since the etching amount of the copper film when $dH_2O_2$ is used is linearly aligned with respect to the etching amount of the copper film when dAPM is used, it is thought that the etching amount of the copper film is more stable when $dH_2O_2$ is used than when dAPM is used.

Also, despite the fact that the mass percent concentration of hydrogen peroxide in dAPM (1.2 wt %) was equal to or less than half of the mass percent concentration of hydrogen peroxide in $dH_2O_2$ (2.8 wt %), the etching amount of the copper film when dAPM was used was larger than the etching amount of the copper film when $dH_2O_2$ was used.

The smaller the etching amount per cycle, the easier it is to control the total etching amount. According to the experimental result shown in FIG. 10, from a viewpoint of controlling the etching amount, it can be said that it is preferable to use $dH_2O_2$ rather than dAPM.

Figure 11:
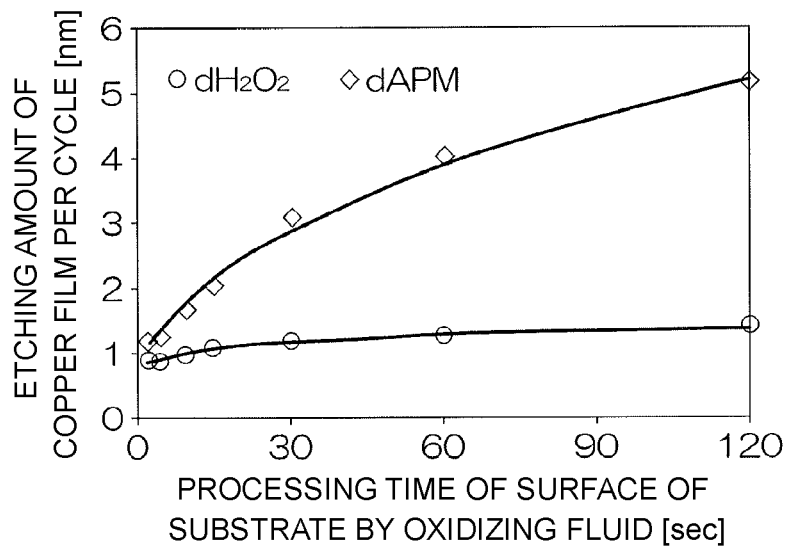
FIG. 11 is a graph showing results from measurement of a time variation of an etching amount of copper on the surface of the substrate.

Next, in order to investigate time dependence of oxidation of the copper film by the oxidizing fluid, time variations of the etching amount were measured. FIG. 11 is a graph showing results from measurement of a time variation of the etching amount of the copper film on the surface of the substrate. The horizontal axis in FIG. 11 represents processing time of the surface of the substrate by the oxidizing fluid. The vertical axis in FIG. 11 represents an etching amount of the copper film per cycle.

As shown in FIG. 11, when dAPM was used as the oxidizing fluid, the etching amount per cycle increased as the processing time became longer. On the other hand, when $dH_2O_2$ was used as the oxidizing fluid, the etching amount reached 0.8 nm in about 3 seconds from the start of the processing. Thereafter, the etching amount did not easily increase even after the processing time has elapsed, and it was about 1.4 nm even at a time point at which about 120 seconds has elapsed after the start of processing. A rate of increase in the etching amount with respect to the processing time when $dH_2O_2$ was used as the oxidizing fluid was smaller than a rate of increase in the etching amount with respect to the processing time when dAPM was used as the oxidizing fluid.

According to the experimental results shown in FIG. 11, it is thought that a limit to the etching amount of the copper film by $dH_2O_2$ per cycle is about 1.0 nm. It can be thought that control of the etching amount with high accuracy can be achieved by using $dH_2O_2$ as the oxidizing fluid. Then, it can be thought that a processing time margin increases.

Next, in order to investigate concentration dependence of etching of the copper film by the oxidizing fluid, variations of the etching amount with respect to a concentration of hydrogen peroxide in the oxidizing fluid were measured.

Figure 12A:
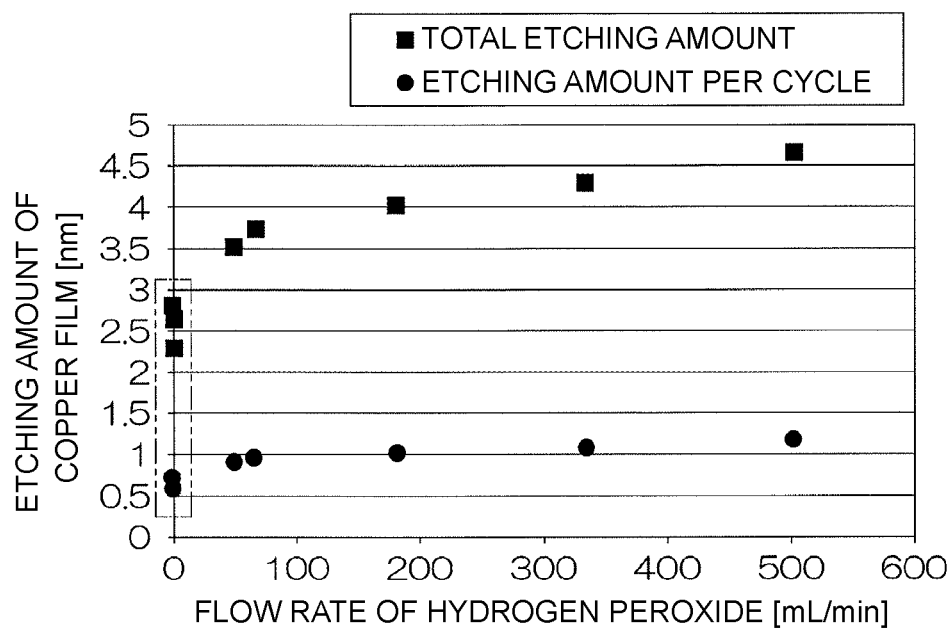
FIG. 12A is a graph showing results from measurement of a variation of the etching amount of the copper film with respect to a flow rate of hydrogen peroxide.
Figure 12B:
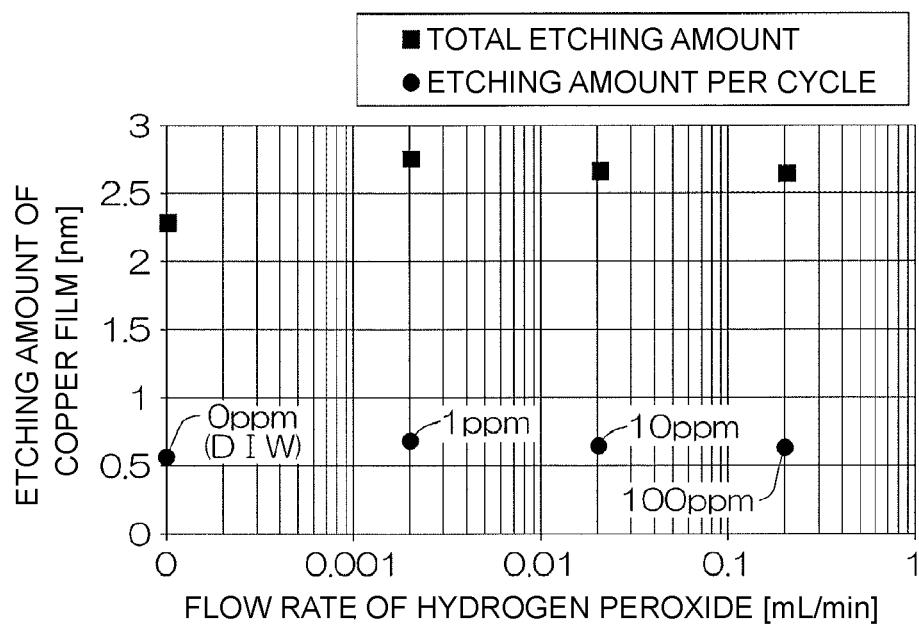
FIG. 12B is a graph in which a region of a low hydrogen peroxide flow rate in FIG. 12A is enlarged.

FIG. 12A is a graph showing results from measurement of a variation of the etching amount of the copper film with respect to a flow rate of hydrogen peroxide. FIG. 12B is a graph in which a region of a hydrogen peroxide flow rate in FIG. 12A (a region illustrated by a two-dot chain line) is enlarged. The horizontal axes in FIGS. 12A and 12B represent a flow rate of hydrogen peroxide in the oxidizing fluid. From a total flow rate of the oxidizing fluid (2 L/min) and a flow rate of hydrogen peroxide, a concentration of hydrogen peroxide in the oxidizing fluid can be calculated. The vertical axes in FIGS. 12A and 12B represent an etching amount of the copper film. In FIGS. 12A and 12B, both the total etching amount due to the cycle etching and an etching amount per cycle are shown.

As illustrated in FIGS. 12A and 12B, the etching amount of the copper film almost did not change even though the concentration of hydrogen peroxide in the oxidizing fluid was changed. Specifically, the etching amount of the copper film per cycle was about 1.0 nm if the concentration of hydrogen peroxide in the oxidizing fluid was 1 ppm or higher.

According to the experimental results shown in FIGS. 12A and 12B, it was ascertained that, by using $dH_2O_2$ as the oxidizing fluid, the control of the etching amount with high accuracy could be achieved and a concentration margin of the oxidizing agent in the oxidizing fluid is large.

Figure 13:
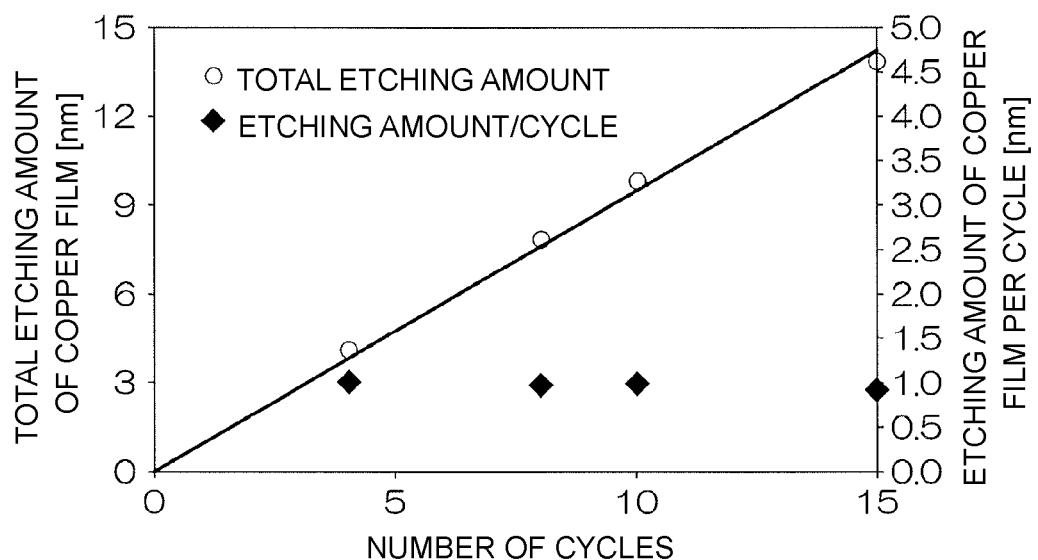
FIG. 13 is a graph showing a relationship between a total etching amount of the copper film due to cycle etching and an etching amount of the copper film per cycle.

FIG. 13 is a graph showing a relationship between a total etching amount of the copper film due to the cycle etching and an etching amount of the copper film per cycle. The horizontal axis in FIG. 13 represents the number of cycles. The vertical axis on the left side in FIG. 13 represents the total etching amount of the copper film due to the cycle etching. The vertical axis on the right side in FIG. 13 represents the etching amount of the copper film per cycle.

As illustrated in FIG. 13, irrespective of the number of cycles in the cycle etching, the etching amount of the copper film per cycle was substantially constant and was about 1.0 nm. That is, a depth of the etching was stable. The etching amount of 1.0 nm corresponds to a length of four copper atoms. That is, a copper oxide layer formed of four atomic layers (several atomic layers) per cycle was formed from the copper film. As described above, self-aligned oxidation of the copper film is achieved by using $dH_2O_2$. It is thought that a copper oxide layer formed of one atomic layer can be formed on the surface of the copper film by adjusting oxidizing power of the oxidizing fluid. When an oxidation fluid having a lower oxidation-reduction potential than $dH_2O_2$ is used, it is thought that a copper oxide layer formed of a fewer number of atomic layers than four atomic layers is formed. Further, when an oxidation fluid having a higher oxidation-reduction potential than $dH_2O_2$ is used, it is thought that a copper oxide layer formed of a larger number of atomic layers than four atomic layers is formed.

Next, an experiment using a substrate in which a copper interconnection is disposed in the trench will be described instead of the substrate having a flat copper film on the surface. This wafer has a pattern formed at a pitch of half of 22.5 nm. In addition, the trench is formed of a low-k film, and a Ta/TaN barrier is formed between the copper interconnection and the low-k film. An atomic force microscope (Nanoscope V manufactured by Veeco), an OCD measurement device (T600 manufactured by Nova), a scanning electron microscope (SEM) (EDR7100 manufactured by KLA-Tencor), and a transmission electron microscope (TEM) (Tecnai F30ST manufactured by FEI) were used to measure the recess amount (etching amount) of the copper interconnection in the trench. Unless otherwise specified, other conditions are the same as those in the above-described experiment.

Figure 14:
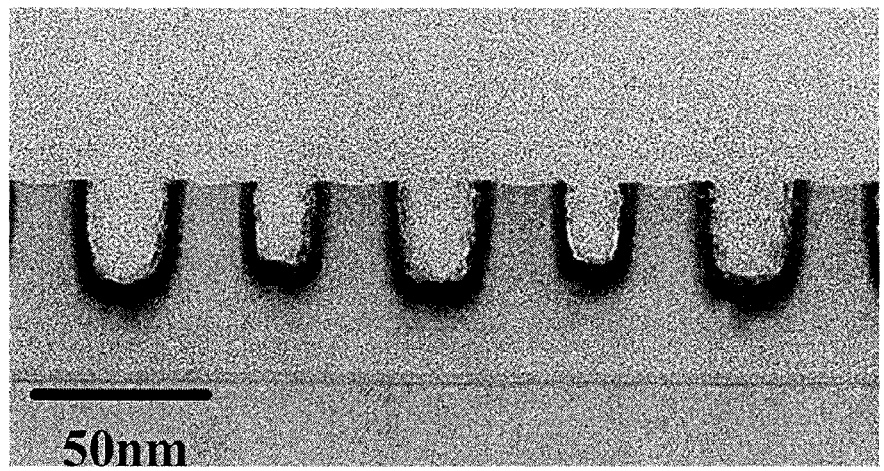
FIG. 14 is a transmission electron microscope (TEM) image of copper interconnections after executing 10 cycles of etching using diluted hydrogen peroxide water as the oxidizing fluid.

FIG. 14 is a TEM image of the copper interconnections after executing 10 cycles of the cycle etching using $dH_2O_2$ as the oxidizing fluid. As illustrated in FIG. 14, despite depths of the trenches being 20 nm to 25 nm, copper interconnections in the trenches were completely removed by 10 cycles of the cycle etching. When a wafer having a flat copper film was used as the substrate, a thickness of the copper film removed by 10 cycles of the cycle etching was about 10 nm (see FIG. 13). In other words, the etching amount per cycle of the copper interconnection in the trench was 2 to 2.5 times the etching amount per cycle of the flat copper film.

Figure 15A:
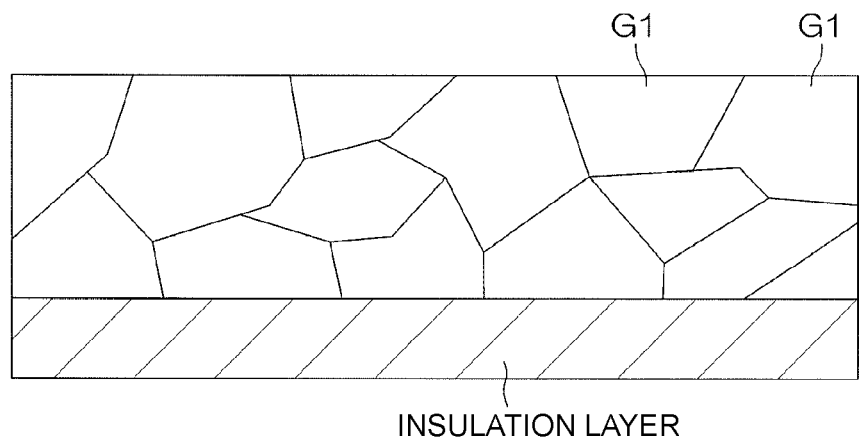
FIG. 15A is a schematic view for describing crystal grains of copper in a flat copper film.
Figure 15B:
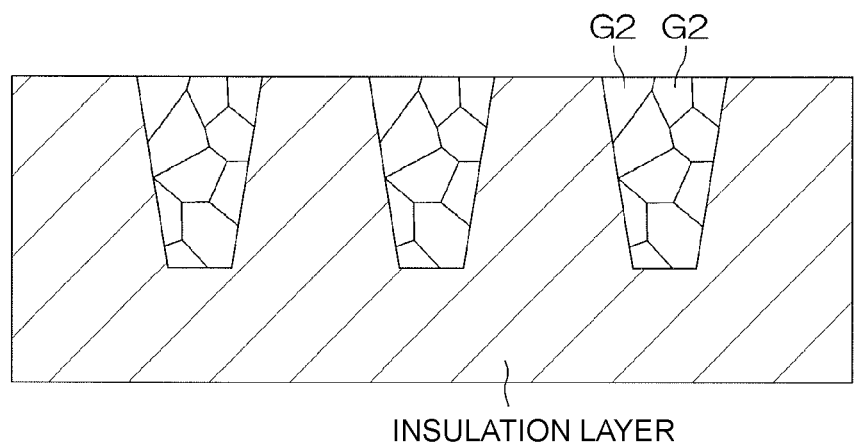
FIG. 15B is a schematic view for describing crystal grains of copper in a copper interconnection disposed in a trench.

It is thought that the difference in thickness of the coppers that have been etched is due to the difference in size of copper crystal grains. Specifically, as illustrated in FIGS. 15A and 15B, crystal grains G1 of copper in the flat copper film are larger than crystal grains G2 of copper in the copper interconnection in the trench. The wafer having the flat copper film was annealed after the copper film was grown by ECD. Therefore, the crystal grains are integrated with each other, and the crystal grains G1 having a large size are formed.

Since it is presumed that a chemical reaction occurs along the boundaries between copper crystal grains at the initial stage of oxidation of the copper by the oxidizing fluid, it is thought that reactions are easily to proceed if the crystal grains are small. This is thought to be the principle that the etching amount of the copper interconnection in the trench per cycle is larger than the etching amount of the flat copper film per cycle. Therefore, it is thought that it is preferable to change the number of cycles of the cycle etching when a flat copper film is etched and when a copper interconnection in the trench is etched.

Figure 16:
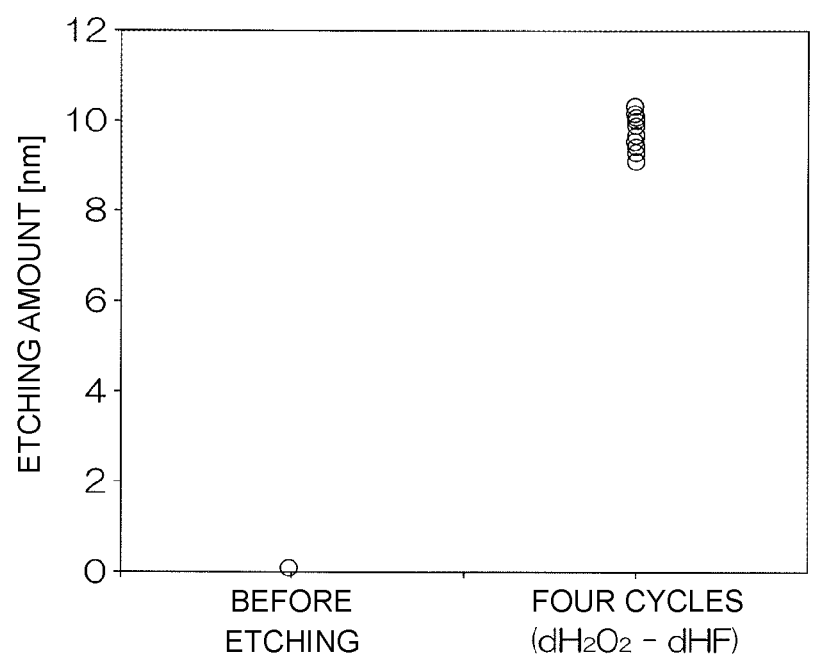
FIG. 16 is a graph showing results from measurement of an etching amount after executing four cycles of etching using diluted hydrogen peroxide water as the oxidizing fluid.
Figure 17A:
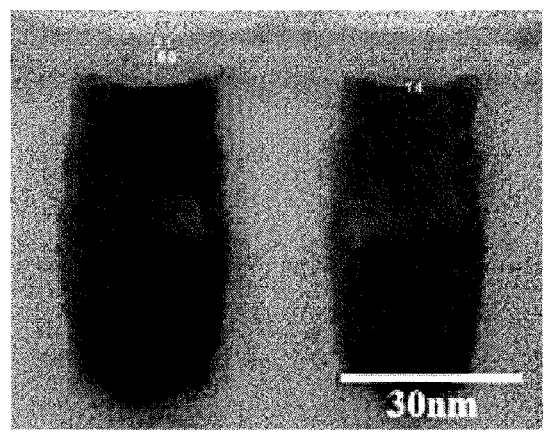
FIGS. 17A to 17D are TEM images and scanning electron microscope (SEM) images showing variations in a state of copper interconnections in trenches before and after cycle etching.
Figure 17B:
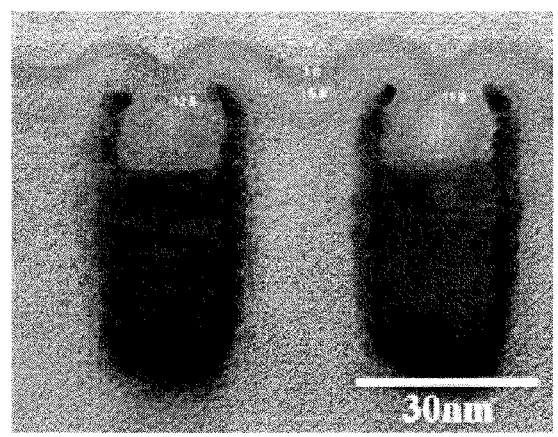
Figure 17C:
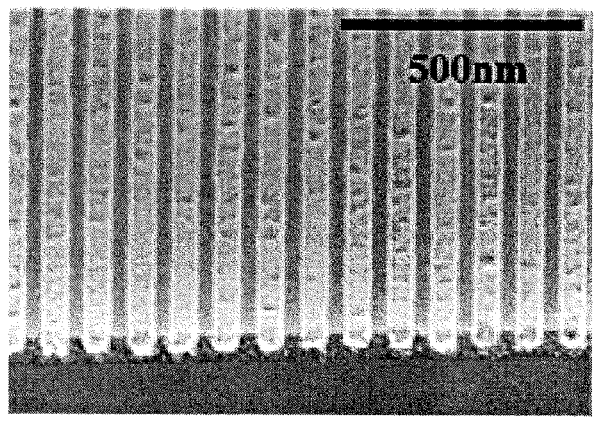
Figure 17D:
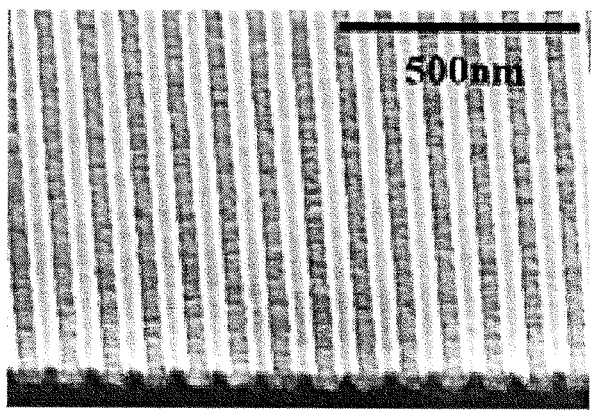

FIG. 16 is a graph showing results from measurement of an etching amount after executing four cycles of the cycle etching using diluted hydrogen peroxide water as the oxidizing fluid. FIGS. 17A to 17D are TEM images and SEM images showing variations in a state of the copper interconnections in the trenches before and after the cycle etching. FIG. 17A is a TEM image showing a state of the copper interconnections before cycle etching, and FIG. 17B is a TEM image showing a state of the copper interconnections after cycle etching (four cycles). FIG. 17C is a SEM image showing a state of surfaces of the copper interconnections before cycle etching, and FIG. 17D is a SEM image showing a state of the surfaces of the copper interconnections after cycle etching (four cycles).

As illustrated in FIG. 16, when the cycle etching was executed four cycles, depths of recesses (etching amounts of the copper interconnections) were about 10 nm. This result is substantially the same as the TEM images shown in FIGS. 17A and 17B. In addition, as illustrated in FIGS. 17C and 17D, the surfaces of the copper interconnections were roughened by performing cycle etching.

Next, in order to improve roughness of the surface of the copper interconnection in the trench that is roughened by the cycle etching, an experiment of irradiating the surface of the copper interconnection with laser was performed. In this experiment, a substrate on which a copper interconnection was disposed in the trench was used. Unless otherwise specified, other conditions are the same as those in the above experiment.

In this experiment, first, LTA processing was performed for the substrate to which cycle etching has been applied. The LTA processing was performed using LT-3000 manufactured by SCREEN Laser Systems & Solutions of Europe. An energy density changed from 0 J/cm$^2$ to 0.65 J/cm$^2$ using this LTA apparatus.

Figure 18:
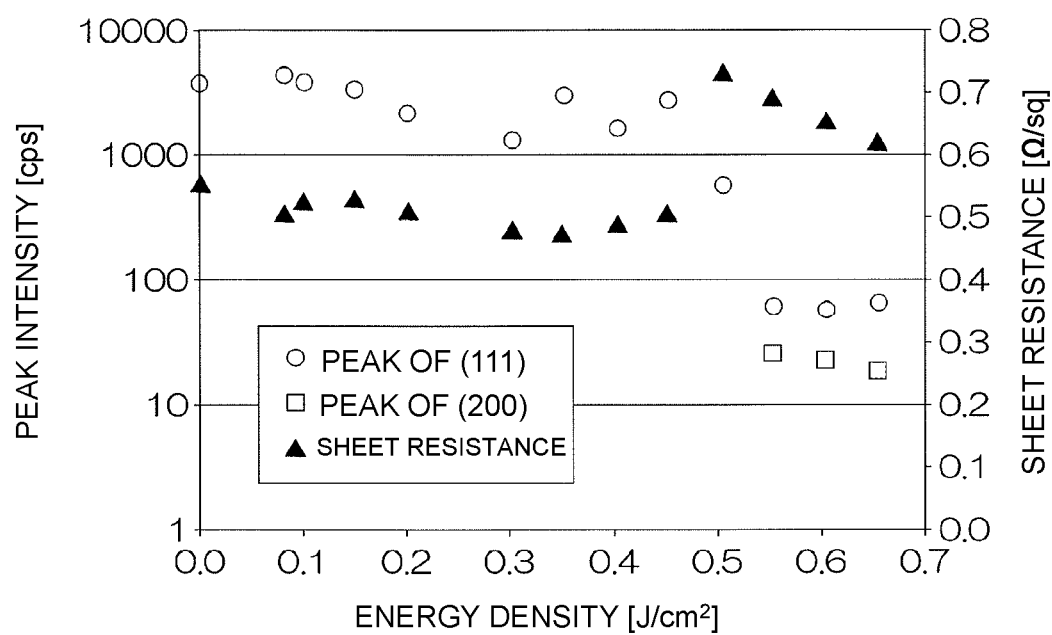
FIG. 18 is a graph showing a variation in sheet resistance and a variation in crystal state of a copper interconnection with respect to an energy density of laser light radiated on the copper interconnection.

First, effects of the LTA processing on a crystal state and resistance of the copper were investigated. The crystal state of copper was measured using an X-ray diffractometer (JVX7300 manufactured by Bruker). FIG. 18 is a graph showing a variation in sheet resistance and a variation in crystal state of the copper interconnection with respect to an energy density of laser irradiated to the copper interconnection. The horizontal axis in FIG. 18 represents an energy density of laser. The vertical axis on the left side in FIG. 18 represents a measurement result by X-ray diffraction (peak intensities showing each crystal state). The vertical axis on the right side in FIG. 18 represents sheet resistance.

Before the laser irradiation, a crystal state of copper was (111), and sheet resistance of the copper at that time was about 0.55 Ω/sq. When the energy density of laser light increased to a value higher than 0.5 J/cm$^2$, the crystal state of some copper changed to (200) and sheet resistance of the copper increased. Therefore, from a viewpoint of the sheet resistance (resistance value), it is thought that the energy density of laser is preferably set to 0.5 J/cm or lower.

Figure 19A:
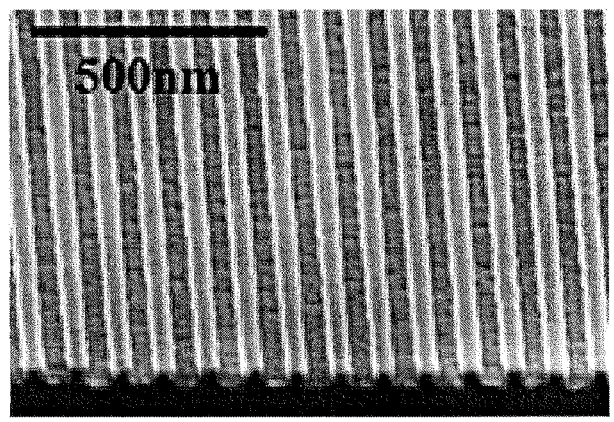
FIGS. 19A to 19D are SEM images showing surface states of copper interconnections after laser light irradiation with different energy densities.
Figure 19B:
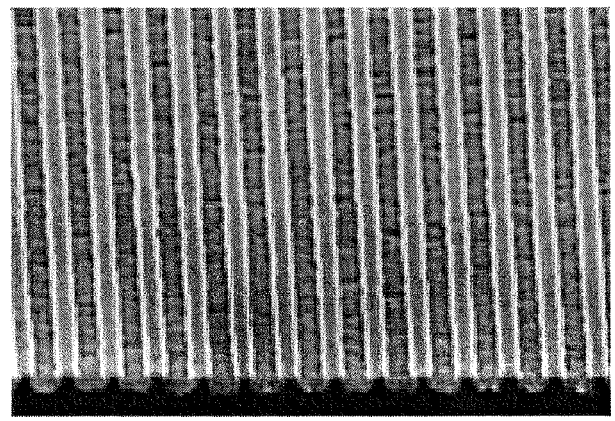
Figure 19C:
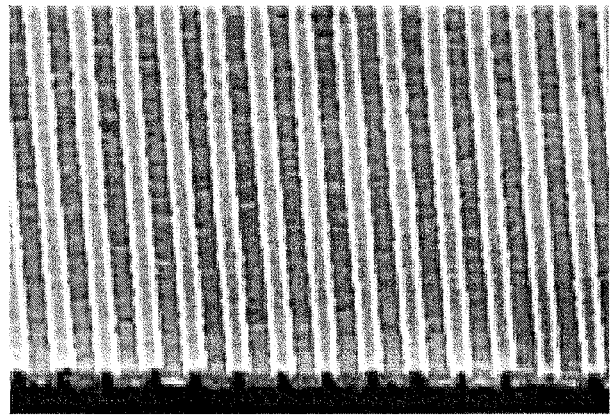
Figure 19D:
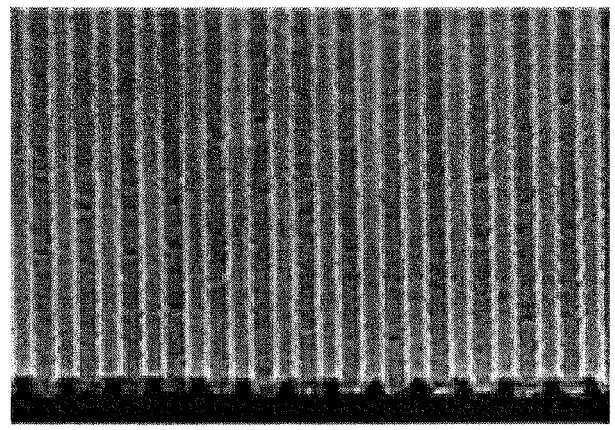

Next, a surface state of the copper interconnection after the LTA processing was measured using a scanning electron microscope (SEM) (EDR7100 manufactured by KLA-Tencor). FIGS. 19A to 19D are SEM images showing surface states of copper interconnections after laser light irradiation with different energy densities. FIG. 19A shows a surface state of the copper interconnection before the LTA processing. FIG. 19B shows a surface state of the copper interconnection after irradiation with laser having an energy density of 0.15 J/cm$^2$. FIG. 19C shows a surface state of the copper interconnection after irradiation with laser having an energy density of 0.3 J/cm$^2$. FIG. 19D shows a surface state of the copper interconnection after irradiation with laser having an energy density of 0.4 J/cm$^2$.

As illustrated in FIGS. 19A and 19B, when laser having an energy density of 0.15 J/cm$^2$ was used, a surface roughness of the copper interconnection was not decreased. On the other hand, as illustrated in FIGS. 19C and 19D, when laser having an energy density of 0.30 J/cm$^2$ or 0.40 J/cm$^2$ was used, the surface roughness of the copper interconnection decreased.

Figure 20:
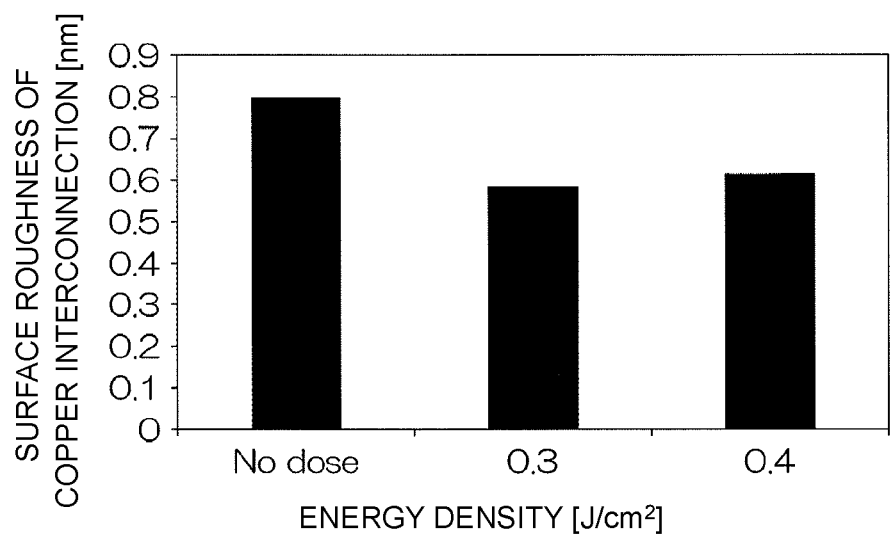
FIG. 20 is a graph showing results from measurement of surface roughness of the copper interconnection before and after laser light irradiation with an atomic force microscope.

In order to quantitatively measure a decrease in the surface roughness of the copper interconnection by the LTA processing, a surface roughness measurement of the copper interconnection was performed using an atomic force microscope (Nanoscope V made by Veeco). FIG. 20 is a graph showing results that the surface roughness of the copper interconnects was measured by the atomic force microscope before and after laser irradiation.

As illustrated in FIG. 20, results in which the surface roughness of the copper interconnection irradiated with laser having the energy density of 0.30 J/cm$^2$ or 0.40 J/cm$^2$ was lower than the surface roughness of the copper interconnection not irradiated with laser was obtained. That is, the surface roughness of the copper interconnection decreased by irradiating the surface of the copper interconnection with laser having the energy density of 0.30 J/cm$^2$ or 0.40 J/cm$^2$.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

Other Configurations

This disclosure is a substrate processing method for processing a substrate having a metal layer on a surface thereof, and the method includes a metal oxide layer forming step of forming a metal oxide layer formed of one atomic layer or several atomic layers on a surface layer of the metal layer by supplying an oxidizing fluid to the surface of the substrate, and a metal oxide layer removing step of selectively removing the metal oxide layer from the surface of the substrate by supplying an etchant to the surface of the substrate.

According to this method, in the metal oxide layer forming step, a metal oxide layer formed of one atomic layer or several atomic layers is formed. A thickness of one atomic layer of a metal and a metal oxide is 1 nm or less (for example, 0.3 nm to 0.4 nm). Therefore, in the metal oxide layer removing step, an etching amount of the metal layer can be controlled with an accuracy of nanometers or smaller by selectively removing the metal oxide layer.

As described above, a method of etching a metal layer in units of one atomic layer or several atomic layers is called atomic layer wet etching (ALWE). Several atomic layers mean two atomic layers to ten atomic layers.

In one embodiment of the disclosure, the metal oxide layer forming step and the metal oxide layer removing step are alternately executed a plurality of times. The metal layer etched each time the metal oxide layer forming step and the metal oxide layer removing step are executed is substantially constant. Therefore, a desired etching amount can be achieved by adjusting the number of repetitive executions of the metal oxide layer forming step and the metal oxide layer removing step.

In one embodiment of the disclosure, the metal oxide layer forming step may include a step of supplying at least one of hydrogen peroxide water, perchloric acid, nitric acid, a mixed liquid of ammonia water and hydrogen peroxide water, ozone dissolved water, oxygen dissolved water, dry air, and ozone gas to the surface of the substrate to form the metal oxide layer.

A thickness of the metal oxide layer formed in the metal oxide layer forming step depends on oxidizing power of the oxidizing fluid. The higher the pH, that is, the higher the basicity, the higher the oxidizing power of the oxidizing fluid. Since the pH of hydrogen peroxide water is 6 to 8, hydrogen peroxide water has oxidizing power suitable for forming a metal oxide layer of one atomic layer to several atomic layers. Accordingly, if a method of supplying hydrogen peroxide water to the surface of the substrate is used to form a metal oxide layer, a metal oxide layer having a thickness of a nanometer or less can be formed.

In one embodiment of the disclosure, the metal oxide layer removing step may include a step of supplying an acidic chemical liquid to the surface of the substrate. Further, in one embodiment of the disclosure, the metal oxide layer removing step may include a step of supplying at least one of dilute hydrofluoric acid, hydrochloric acid, acetic acid, citric acid, and glycolic acid as the acidic chemical liquid to the surface of the substrate.

In one embodiment of the disclosure, the metal oxide layer removing step includes a degassed etchant supply step of supplying a degassed etchant to the surface of the substrate.

When an oxygen concentration (dissolved oxygen concentration) in the etchant is high, there is a concern that the metal layer on the surface of the substrate may be oxidized by the oxygen in the etchant to become a metal oxide layer. In this case, portions of the metal layer that have not been oxidized by the oxidizing fluid are also etched by the etchant. That is, selectivity of removal of the metal oxide layer may decrease (etching amounts may change). Therefore, by using the degassed etchant, the selectivity of removal of the metal oxide layer can be enhanced. Therefore, the etching amount can be controlled with high accuracy.

In one embodiment of the disclosure, the substrate processing method further includes a degassing step of degassing an etchant in an etchant tank by sending an inert gas to the etchant in the etchant tank. Also, the degassed etchant supply step includes a step of supplying the etchant degassed in the degassing step to the surface of the substrate.

According to this method, the etchant in the etchant tank can be degassed by sending an inert gas into the etchant in the etchant tank. Thereby, a dissolved oxygen concentration in the etchant is sufficiently decreased. Therefore, in the degassed etchant supply step, the etchant that has been sufficiently decreased in dissolved oxygen concentration can be supplied to the surface of the substrate.

In one embodiment of the disclosure, the degassed etchant supply step includes a step of supplying the degassed etchant to the surface of the substrate while maintaining the dissolved oxygen concentration of the degassed etchant.

There is a concern that oxygen present in the atmosphere around the etchant being dissolved in the etchant before the etchant supplied to the surface of the substrate may react with the metal oxide layer on the surface of the substrate. This decreases selectivity of removal of the metal oxide layer. Therefore, the selectivity of removal of the metal oxide layer can be improved by supplying the etchant to the surface of the substrate while maintaining the dissolved oxygen concentration of the etchant at the time of degassing.

In one embodiment of the disclosure, the substrate processing method further includes a substrate holding step of holding the substrate horizontally, and a replacement step of replacing an atmosphere in a space between a facing portion of a facing member in which the facing portion facing the substrate from above is included and the substrate with an inert gas by supplying the inert gas toward the space. Then, the degassed etchant supply step is executed after the atmosphere in the space is replaced with the inert gas.

According to this method, the atmosphere in the space between the surface of the substrate and the facing portion is replaced with an inert gas. That is, oxygen is excluded from the atmosphere around the surface of the substrate. Therefore, it is possible to suppress or prevent oxygen dissolved in the etchant supplied to the surface of the substrate from causing an increase in the dissolved oxygen. Accordingly, the etchant maintaining the dissolved oxygen concentration immediately after degassing can be supplied to the surface of the substrate.

In one embodiment of the disclosure, the substrate processing method further includes a facing member disposing step of disposing the facing member so that an annular portion extending downward from the facing portion and surrounding the substrate in a plan view surrounds the substrate from a lateral side. Also, the facing member disposing step is executed before starting the replacement step.

A degree of airtightness of the space between the surface of the substrate and the facing portion can be enhanced due to the substrate being surrounded by the annular portion from the lateral side. Therefore, after the atmosphere in the space is replaced with an inert gas, an inflow of oxygen from the outside into the space is suppressed. Accordingly, the etchant maintaining the dissolved oxygen concentration immediately after degassing can be supplied to the surface of the substrate.

In one embodiment of the disclosure, the substrate processing method further includes a first rinsing step, executed between the metal oxide layer forming step and the metal oxide layer removing step, of washing away the oxidizing fluid that has adhered to the surface of the substrate by supplying a first rinsing liquid to the surface of the substrate.

When an etchant is supplied to the surface of the substrate in a state in which the oxidizing fluid remains on the surface of the substrate, there is a concern that a metal layer newly exposed due to removal of the metal oxide layer may be oxidized by the oxidizing fluid remaining on the surface of the substrate. In this case, the etching amount may be changed. Therefore, by washing away the oxidizing fluid on the substrate by the first rinsing liquid, the etching amount can be controlled with high accuracy.

In one embodiment of the disclosure, the first rinsing step includes a degassed rinsing liquid supply step of supplying a degassed first rinsing liquid to the surface of the substrate. Even though the oxidizing fluid is washed away by the first rinsing liquid, there is a concern that of a metal layer newly exposed due to removal of the metal oxide layer may be oxidized by dissolved oxygen in the first rinsing liquid. Therefore, by using the degassed first rinsing liquid, the oxidation of the metal layer newly exposed due to removal of the metal oxide layer can be suppressed.

In one embodiment of the disclosure, the substrate processing method further includes a second rinsing step, executed after the metal oxide layer removing step, of washing away the etchant that has adhered to the surface of the substrate by supplying a second rinsing liquid to the surface of the substrate.

When the etchant remains on the surface of the substrate after removing the metal oxide layer, oxygen in the atmosphere around the surface of the substrate is newly dissolved in the etchant. Therefore, there is a concern that a metal layer newly exposed due to removal of the metal oxide layer by the etchant may be oxidized by this oxygen. This may decrease selectivity of removal of the metal oxide layer. Therefore, by washing away the etchant that has adhered to the substrate by the second rinsing liquid, the etching amount can be controlled with high accuracy.

In one embodiment of the disclosure, the metal layer may include at least one of a copper layer and a cobalt layer.

In one embodiment of the disclosure, the substrate includes an insulation layer in which a trench is formed. Also, the metal layer includes a metal interconnection disposed in the trench. A width of the metal interconnection is easily affected by miniaturization. Even in such a case, etching of the metal layer can be controlled with an accuracy of nanometers or smaller.

In one embodiment of the disclosure, the substrate processing method further includes a coating film forming step of forming a coating film which covers the surface of the substrate by supplying a coating agent to the surface of the substrate after the last metal oxide layer removing step has ended.

After the last metal oxide layer removing step has ended, the metal layer on the surface of the substrate may be oxidized due to oxygen or moisture in the atmosphere around the substrate. Therefore, by forming the coating film covering the surface of the substrate, the metal layer can be protected.

One embodiment of the disclosure includes a laser irradiation step of irradiating the surface of the substrate with laser after the last metal oxide layer removing step has ended. Therefore, the surface of the metal layer can be melted by the laser light irradiation. As a result, the surface of the metal layer can be smoothed. It is preferable to irradiate the surface of the substrate with laser light having an energy density of 0.2 J/cm$^2$ or higher and 0.5 J/cm$^2$ or lower.

According to another embodiment of the disclosure, a substrate processing apparatus is provided to include a substrate holding unit which horizontally holds a substrate having a metal layer on a surface thereof, an oxidizing fluid supply unit which supplies an oxidizing fluid to the surface of the substrate, an etchant supply unit which supplies an etchant to the surface of the substrate, and a controller which controls the oxidizing fluid supply unit and the etchant supply unit. Also, the controller is programmed to execute a metal oxide layer forming step of forming a metal oxide layer formed of one atomic layer or several atomic layers on a surface layer of the metal layer by supplying the oxidizing fluid from the oxidizing fluid supply unit to the surface of the substrate, and a metal oxide layer removing step of selectively removing the metal oxide layer from the surface of the substrate by supplying the etchant from the etchant supply unit to the surface of the substrate.

According to this configuration, in the metal oxide layer forming step, a metal oxide layer formed of one atomic layer or several atomic layers is formed. A thickness of one atomic layer of a metal and a metal oxide is 1 nm or less (for example, 0.3 nm to 0.4 nm). Therefore, in the metal oxide layer removing step, an etching amount of the metal layer can be controlled with an accuracy of nanometers or smaller by selectively removing the metal oxide layer.

In one embodiment of the disclosure, the controller is programmed such that the metal oxide layer forming step and the metal oxide layer removing step are alternately executed a plurality of times. Each time the metal oxide layer forming step and the metal oxide layer removing step are executed, the metal layer is etched by one atomic layer or several atomic layers. Therefore, a desired etching amount can be achieved by adjusting the number of repetitive executions of the metal oxide layer forming step and the metal oxide layer removing step.

In one embodiment of the disclosure, the oxidizing fluid supply unit may supply at least one of hydrogen peroxide water, perchloric acid, nitric acid, a mixed liquid of ammonia water and hydrogen peroxide water, ozone dissolved water, oxygen dissolved water, dry air, and ozone gas to the surface of the substrate.

A thickness of the metal oxide layer formed in the metal oxide layer forming step depends on oxidizing power of the oxidizing fluid. The higher the pH, that is, the higher the basicity, the higher the oxidizing power of the oxidizing fluid. Since the pH of hydrogen peroxide water is 6 to 8, hydrogen peroxide water has oxidizing power suitable for forming a metal oxide layer of one atomic layer to several atomic layers. Accordingly, when the oxidizing fluid supply unit has a configuration including a hydrogen peroxide water supply unit for supplying hydrogen peroxide water to the surface of the substrate, a metal oxide layer having a thickness of a nanometer or less can be formed.

In one embodiment of the disclosure, the etchant supply unit may include an acidic chemical liquid supply unit which supplies an acidic chemical liquid to the surface of the substrate. The acidic chemical liquid may contain at least one of hydrofluoric acid, hydrochloric acid, acetic acid, citric acid, and glycolic acid.

In one embodiment of the disclosure, the etchant supply unit supplies a degassed etchant to the surface of the substrate.

When an oxygen concentration (dissolved oxygen concentration) in the etchant is high, there is a concern that the metal layer on the surface of the substrate may be oxidized by the oxygen in the etchant to become a metal oxide layer. In this case, portions of the metal layer that have not been oxidized by the oxidizing fluid are also etched by the etchant. That is, selectivity of removal of the metal oxide layer may decrease. Therefore, by using the degassed etchant, the selectivity of removal of the metal oxide layer can be enhanced. Therefore, the etching amount can be controlled with high accuracy.

In one embodiment of the disclosure, the substrate processing apparatus further includes an etchant tank which stores the etchant, and a bubbling unit which degasses the etchant in the etchant tank by sending an inert gas to the etchant in the etchant tank. Then, the etchant supply unit supplies the etchant degassed by the bubbling unit to the surface of the substrate.

According to this configuration, the etchant can be degassed by sending an inert gas from the bubbling unit into the etchant in the etchant tank. Thereby, a dissolved oxygen concentration in the etchant is sufficiently decreased. Therefore, in the degassed etchant supply step, the etchant that has been sufficiently decreased in dissolved oxygen concentration can be supplied to the surface of the substrate.

In one embodiment of the disclosure, the substrate processing apparatus further includes a facing member including a facing portion that faces the substrate from above and is raised and lowered with respect to the substrate holding unit, and an inert gas supply unit that supplies an inert gas toward a space between the facing portion and the substrate.

Also, the controller is programmed to execute a replacement step of replacing an atmosphere in the space with the inert gas by supplying the inert gas from the inert gas supply unit toward the space, and an etchant supply step of supplying the etchant from the etchant supply unit to an upper surface of the substrate after the atmosphere in the space is replaced with the inert gas.

According to this configuration, the atmosphere in the space between the surface of the substrate and the facing portion is replaced with an inert gas. That is, oxygen is excluded from the atmosphere around the surface of the substrate. Accordingly, it is possible to suppress or prevent oxygen dissolved in the etchant supplied to the surface of the substrate from causing an increase in the dissolved oxygen.

In one embodiment of the disclosure, the facing member includes an annular portion extending downward from the facing portion and surrounding the substrate in a plan view. Also, the controller is programmed to execute a facing member disposing step of disposing the facing member so that the annular portion surrounds the substrate from a lateral side before starting the replacement step.

A degree of airtightness of the space between the surface of the substrate and the facing portion can be enhanced due to the substrate being surrounded by the annular portion from the lateral side. Therefore, after the atmosphere in the space is replaced with an inert gas, an inflow of oxygen from the outside into the space is suppressed. Accordingly, it is possible to suppress or prevent oxygen dissolved in the etchant supplied to the surface of the substrate from causing an increase in the dissolved oxygen.

In one embodiment of the disclosure, the substrate processing apparatus further includes a first rinsing liquid supply unit which supplies a first rinsing liquid to the surface of the substrate. Also, the controller is programmed to execute a first rinsing step of washing away the oxidizing fluid that has adhered to the surface of the substrate by supplying the first rinsing liquid to the surface of the substrate between the metal oxide layer forming step and the metal oxide layer removing step.

When an etchant is supplied to the surface of the substrate in a state in which the oxidizing fluid remains on the surface of the substrate, there is a concern that a metal layer newly exposed due to removal of the metal oxide layer may be oxidized by the oxidizing fluid remaining on the surface of the substrate. In this case, the etching amount may be changed. Therefore, by washing away the oxidizing fluid on the substrate by the first rinsing liquid, the etching amount can be controlled with high accuracy.

In one embodiment of the disclosure, the first rinsing liquid supply unit supplies a degassed first rinsing liquid to the surface of the substrate. Even when the oxidizing fluid is washed away by the first rinsing liquid, there is a concern that a metal layer newly exposed due to removal of the metal oxide layer may be oxidized by dissolved oxygen in the first rinsing liquid. Therefore, when the degassed first rinsing liquid is used, the oxidation of the metal layer newly exposed due to removal of the metal oxide layer can be suppressed.

In one embodiment of the disclosure, the substrate processing apparatus further includes a second rinsing liquid supply unit which supplies a second rinsing liquid to the surface of the substrate. Also, the controller is programmed to execute a second rinsing step of washing away the etchant that has adhered to the surface of the substrate by supplying the second rinsing liquid to the surface of the substrate after the metal oxide layer removing step.

When the etchant remains on the surface of the substrate after removing the metal oxide layer, oxygen in the atmosphere around the surface of the substrate is newly dissolved in the etchant. Therefore, there is a concern that a metal layer newly exposed due to removal of the metal oxide layer by the etchant may be oxidized by this oxygen. This may decrease selectivity of removal of the metal oxide layer. Therefore, by washing away the etchant that has adhered to the substrate by the second rinsing liquid, the etching amount can be controlled with high accuracy.

In one embodiment of the disclosure, the metal layer may include at least one of a copper layer and a cobalt layer.

In one embodiment of the disclosure, the substrate includes an insulation layer in which a trench is formed. Also, the metal layer includes a metal interconnection disposed in the trench. A width of the metal interconnection is easily affected by miniaturization. Even in such a case, etching of the metal layer can be controlled with an accuracy of nanometers or smaller.

In one embodiment of the disclosure, the substrate processing apparatus further includes a coating agent supply unit which supplies a coating agent covering the surface of the substrate to the surface of the substrate. Also, the controller is programmed to execute a coating film forming step of forming a coating film by supplying the coating agent from the coating agent supply unit to the surface of the substrate after the last metal oxide layer removing step has ended.

After the last metal oxide layer removing step has ended, the metal layer on the surface of the substrate may be oxidized due to oxygen or moisture in the atmosphere around the substrate. Therefore, by forming the coating film covering the surface of the substrate, the metal layer can be protected.

In one embodiment of the disclosure, the substrate processing apparatus further includes a laser irradiation unit which irradiates the surface of the substrate with a laser after the last metal oxide layer removing step has ended. Therefore, the surface of the metal layer can be melted by the laser irradiation. As a result, the surface of the metal layer can be smoothed. It is preferable to irradiate the surface of the substrate with the laser having an energy density of 0.2 $J/cm^2$ or higher and 0.5 $J/cm^2$ or lower.

What is claimed is:

1. A substrate processing method, processing a substrate having a metal layer on a surface thereof, the method comprising:
    a metal oxide layer forming step, forming a metal oxide layer formed of one atomic layer or several atomic layers on a surface layer of the metal layer by supplying an oxidizing liquid to the surface of the substrate;
    a first rinse liquid supplying step of supplying a first rinse liquid to the surface of the substrate, after the metal oxide layer forming step;
    a metal oxide layer removing step, selectively removing the metal oxide layer from the surface of the substrate by supplying an etchant to the surface of the substrate, after the first rinse liquid supplying step; and
    a second rinse liquid supplying step of supplying a second rinse liquid to the surface of the substrate, after the metal oxide layer removing step,
    wherein an etching amount of the metal layer is controlled with an accuracy of nanometers or smaller by executing an etching process which includes multiple cycles of the metal oxide layer forming step and the metal oxide layer removing step as one cycle.

2. The substrate processing method according to claim 1, wherein the metal oxide layer forming step includes a step of supplying at least one of hydrogen peroxide water, perchloric acid, nitric acid, a mixed liquid of ammonia water and hydrogen peroxide water, ozone dissolved water and oxygen dissolved water to the surface of the substrate to form the metal oxide layer.

3. The substrate processing method according to claim 2, wherein the metal oxide layer forming step includes a hydrogen peroxide water supply step of supplying hydrogen peroxide water to the surface of the substrate to form the metal oxide layer.

4. The substrate processing method according to claim 1, wherein the metal oxide layer removing step includes a step of supplying an acidic chemical liquid to the surface of the substrate.

5. The substrate processing method according to claim 4, wherein the metal oxide layer removing step includes a step of supplying at least one of dilute hydrofluoric acid, hydrochloric acid, acetic acid, citric acid, and glycolic acid as the acidic chemical liquid to the surface of the substrate.

6. The substrate processing method according to claim 1, wherein the metal oxide layer removing step includes a degassed etchant supply step of supplying a degassed etchant to the surface of the substrate.

7. The substrate processing method according to claim 6, further comprising:
a degassing step of degassing an etchant in an etchant tank by sending an inert gas to the etchant in the etchant tank,
wherein the degassed etchant supply step includes a step of supplying the etchant degassed by the degassing step to the surface of the substrate.

8. The substrate processing method according to claim 6, wherein the degassed etchant supply step includes a step of supplying the degassed etchant to the surface of the substrate while maintaining a dissolved oxygen concentration of the degassed etchant.

9. The substrate processing method according to claim 8, further comprising:
a substrate holding step of holding the substrate horizontally; and
a replacement step of replacing an atmosphere in a space between a facing portion of a facing member in which the facing portion facing the substrate from above is included and the substrate with an inert gas by supplying the inert gas toward the space,
wherein the degassed etchant supply step is executed after the atmosphere in the space is replaced with the inert gas.

10. The substrate processing method according to claim 9, further comprising:
a facing member disposing step of disposing the facing member so that an annular portion surrounds the substrate from a lateral side, where the annular portion extends downward from the facing portion and surrounding the substrate in a plan view,
wherein the facing member disposing step is executed before starting the replacement step.

11. The substrate processing method according to claim 1, wherein, in the first rinse liquid supplying step, the oxidizing liquid that has adhered to the surface of the substrate is washed away by supplying the first rinsing liquid to the surface of the substrate.

12. The substrate processing method according to claim 11, wherein the first rinse liquid supplying step includes a degassed rinsing liquid supply step of supplying a degassed first rinsing liquid to the surface of the substrate.

13. The substrate processing method according to claim 1, wherein,
in the first rinse liquid supplying step, the etchant that has adhered to the surface of the substrate is washed away by supplying the second rinsing liquid to the surface of the substrate.

14. The substrate processing method according to claim 1, wherein the metal layer includes at least one of a copper layer and a cobalt layer.

15. The substrate processing method according to claim 1, wherein:
the substrate includes an insulation layer in which a trench is formed; and
the metal layer includes a metal interconnection disposed in the trench.

16. The substrate processing method according to claim 1, further comprising:
a coating film forming step of forming a coating film which covers the surface of the substrate by supplying a coating agent to the surface of the substrate after the last metal oxide layer removing step has ended.

17. The substrate processing method according to claim 1, further comprising:
a laser irradiation step of irradiating the surface of the substrate with a laser after the last metal oxide layer removing step has ended.

18. The substrate processing method according to claim 17, wherein the laser irradiation step includes a step of irradiating the surface of the substrate with the laser, and the laser has an energy density of $0.2$ $J/cm^2$ or higher and $0.5$ $J/cm^2$ or lower.

19. A substrate processing method, processing a substrate having a metal layer on a surface thereof, the method comprising:
a substrate holding step of holding the substrate horizontally;
a replacement step of replacing an atmosphere in a space between a facing portion of a facing member in which the facing portion facing the substrate from above is included and the substrate with an inert gas by supplying the inert gas toward the space;
a metal oxide layer forming step, forming a metal oxide layer formed of one atomic layer or several atomic layers on a surface layer of the metal layer by supplying an oxidizing liquid to the surface of the substrate; and
a metal oxide layer removing step, selectively removing the metal oxide layer from the surface of the substrate by supplying an etchant to the surface of the substrate,
wherein the metal oxide layer removing step includes a degassed etchant supply step of supplying a degassed etchant to the surface of the substrate, and
the degassed etchant supply step is executed after the atmosphere in the space is replaced with the inert gas.

20. The substrate processing method according to claim 19, wherein the step of supplying the degassed etchant to the surface of the substrate is executed, while maintaining a dissolved oxygen concentration of the degassed etchant.

21. The substrate processing method according to claim 19, wherein the method further comprises a facing member disposing step of disposing the facing member so that an annular portion surrounds the substrate from a lateral side, where the annular portion extends downward from the facing portion and surrounding the substrate in a plan view, and
the facing member disposing step is executed before starting the replacement step.

22. A substrate processing method, processing a substrate having a metal layer on a surface thereof, the method comprising:
a substrate holding step of holding the substrate horizontally;
a replacement step of replacing an atmosphere in a space between a facing portion of a facing member in which the facing portion facing the substrate from above is included and the substrate with an inert gas by supplying the inert gas toward the space;
a first rinse liquid supplying step of supplying a first rinse liquid to the surface of the substrate, after the metal oxide layer forming step;
a metal oxide layer forming step, forming a metal oxide layer formed of one atomic layer or several atomic layers on a surface layer of the metal layer by supplying an oxidizing liquid to the surface of the substrate, after the first rinse liquid supplying step; and
a second rinse liquid supplying step of supplying a second rinse liquid to the surface of the substrate, after the metal oxide layer removing step,
wherein the first rinse liquid which is degassed is supplied to the surface of the substrate in the first rinse liquid supplying step, and the first rinse liquid supplying step is executed after the atmosphere in the space is replaced with the inert gas.

23. The substrate processing method according to claim 22, wherein, in the first rinse supplying step, the degassed first rinse liquid is supplied to the surface of the substrate while maintaining a dissolved oxygen concentration of the degassed first rinse liquid.

24. The substrate processing method according to claim 22, wherein the method further comprises a facing member disposing step of disposing the facing member so that an annular portion surrounds the substrate from a lateral side, where the annular portion extends downward from the facing portion and surrounding the substrate in a plan view, and the first rinse liquid supplying step is executed after the atmosphere in the space is replaced with the inert gas.

* * * * *